(12) United States Patent
Lee et al.

(10) Patent No.: US 11,397,639 B2
(45) Date of Patent: Jul. 26, 2022

(54) MEMORY SYSTEM AND OPERATING METHOD THEREOF

(71) Applicant: SK hynix Inc., Gyeonggi-do (KR)

(72) Inventors: Seon Ju Lee, Gyeonggi-do (KR); Min Hwan Moon, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 79 days.

(21) Appl. No.: 16/927,106

(22) Filed: Jul. 13, 2020

(65) Prior Publication Data

US 2020/0341842 A1 Oct. 29, 2020

Related U.S. Application Data

(63) Continuation of application No. 15/926,074, filed on Mar. 20, 2018, now Pat. No. 10,725,858.

(30) Foreign Application Priority Data

Aug. 14, 2017 (KR) .................. 10-2017-0103154

(51) Int. Cl.
*G06F 11/10* (2006.01)
*G11C 16/26* (2006.01)
(Continued)

(52) U.S. Cl.
CPC ...... *G06F 11/1068* (2013.01); *G06F 11/1048* (2013.01); *G11C 16/0466* (2013.01);
(Continued)

(58) Field of Classification Search
None
See application file for complete search history.

(56) References Cited

U.S. PATENT DOCUMENTS

2012/0236656 A1 9/2012 Cometti
2013/0194883 A1 8/2013 Lee
(Continued)

FOREIGN PATENT DOCUMENTS

| CN | 104051016 A | 9/2014 |
|---|---|---|
| KR | 10-2013-0034522 A | 4/2013 |
| KR | 10-2016-0005264 A | 1/2016 |

OTHER PUBLICATIONS

Notice of Allowance issued by the Korean Intellectual Property Office dated Dec. 27, 2021.
(Continued)

*Primary Examiner* — Guerrier Merant
(74) *Attorney, Agent, or Firm* — IP & T Group LLP

(57) ABSTRACT

A method for operating a memory system includes: performing a read operation in response to a first tag; performing a read operation in response to a second tag; performing a defense code operation corresponding to the first tag; performing an error correction code (KC) operation on data output through the defense code operation corresponding to the first tag; and performing a defense code operation corresponding to the second tag, wherein the read operation in response to the second tag is started before the ECC operation corresponding to the first tag is completed, and wherein the defense code operation corresponding to the second tag is performed using a result of the defense code operation corresponding to the first tag.

10 Claims, 13 Drawing Sheets

(51) Int. Cl.
*G11C 16/04* (2006.01)
*G11C 29/52* (2006.01)
*G11C 29/02* (2006.01)
*G11C 29/04* (2006.01)

(52) U.S. Cl.
CPC ............ *G11C 16/26* (2013.01); *G11C 29/021* (2013.01); *G11C 29/028* (2013.01); *G11C 29/52* (2013.01); *G11C 16/0483* (2013.01); *G11C 2029/0411* (2013.01)

(56) References Cited

U.S. PATENT DOCUMENTS

| | | | | |
|---|---|---|---|---|
| 2014/0063967 A1* | 3/2014 | Ahn | ........................ | G11C 16/26 365/185.18 |
| 2014/0101519 A1* | 4/2014 | Lee | ........................ | G11C 16/26 714/773 |
| 2014/0281770 A1* | 9/2014 | Kim | .................. | G11C 16/3418 714/721 |
| 2015/0287453 A1 | 10/2015 | Wu et al. | | |

OTHER PUBLICATIONS

Office Action issued by the China National Intellectual Property Administration dated Aug. 18, 2021.
Office Action issued by the Chinese Patent Office dated Jan. 28, 2022.

\* cited by examiner

MEMORY SYSTEM AND OPERATING METHOD THEREOF

CROSS-REFERENCE TO RELATED APPLICATION

This application is a continuation of U.S. patent application Ser. No. 15/926,074 filed on Mar. 20, 2018, which claims benefits of priority of Korean Patent Application No, 10-2017-0103154 filed on Aug. 14, 2017. The disclosure of each of the foregoing application is incorporated herein by reference in its entirety.

BACKGROUND

Field of Invention

The present disclosure relates generally to a memory system and, more particularly, to an operating method for a memory system capable of decreasing the read latency of the memory system.

Description of Related Art

Memory devices are classified into volatile memory devices and nonvolatile memory devices. A major difference between volatile and nonvolatile memory devices is that nonvolatile memory devices retain stored data when power is turned off while volatile memory devices do not. Examples of nonvolatile memory devices are a read only memory (ROM), an electrically erasable programmable read-only memory (EEPROM), and the like.

The structure and operation of a flash memory device introduced as a flash EEPROM are different from those of typical EEPROMs. The flash memory device may perform an electric erase operation in units of blocks and perform a program operation in units of bits.

Threshold voltages of a plurality of programmed memory cells included in the flash memory device may be changed depending on several factors, such as, for example, floating gate coupling, charge loss as time elapses, and the like.

A change in the threshold voltages of a plurality of memory cells may cause a read operation to fail. Typically, in order to prevent read operation from being failed, an optimum read voltage is searched, and the read operation may be retried using the searched optimum read voltage. However, this may increase the read latency of the memory system employing the memory device.

SUMMARY

Various embodiments of the present disclosure provide an operating method for a memory system which can decrease the read latency of the memory system.

According to an aspect of the present disclosure, there is provided a method for operating a memory system, the method including: performing a read operation in response to a first tag; performing a read operation in response to a second tag; performing a defense code operation corresponding to the first tag; performing an error correction code (ECC) operation on data output through the defense code operation corresponding to the first tag; and performing a defense code operation corresponding to the second tag, wherein the read operation in response to the second tag is started before the ECC operation corresponding to the first tag is completed, and wherein the defense code operation corresponding to the second tag is performed using a result of the defense code operation corresponding to the first tag.

According to another aspect of the present disclosure, there is provided a method for operating a memory system, the method including: performing a read operation in response to a first tag; performing a read retry operation corresponding to a second tag; performing an ECC operation on data output through the read retry operation corresponding to the second tag; and performing a read retry operation corresponding to the first tag, wherein the read operation in response to the first tag is started before the entry of the read retry operation corresponding to the second tag, and wherein the read retry operation corresponding to the first tag is performed based on a voltage condition of the read retry operation corresponding to the second tag.

According to still another aspect of the present disclosure, there is provided a method for operating a memory system, the method including: performing a read operation in response to a first tag; performing a read operation in response to a second tag; performing a defense code operation corresponding to the first tag; performing a program operation in response to a third tag; and performing a defense code operation corresponding to the second tag after the program operation in response to the third tag is completed, wherein the defense code operation corresponding to the second tag is performed by using a result of the defense code operation corresponding to the first tag.

According to still another aspect of the present disclosure, there is provided a method for operating a memory system, the method including: performing first and second defense code operations corresponding to first and second read operations, respectively; and performing first and second ECC operations corresponding to the first and second defense code operations, respectively, wherein the second read operation is performed before completion of the first ECC operation, and wherein the second defense code operation is performed according to a result of the first defense code operation.

BRIEF DESCRIPTION OF THE DRAWINGS

Various exemplary embodiments of the present invention will now be described more fully hereinafter with reference to the accompanying drawings; however, it is noted that the invention may be embodied in different forms and should not be construed as limited to the embodiments set forth herein. Rather, these embodiments are provided so that this disclosure will be thorough and complete, and will fully convey the present invention to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
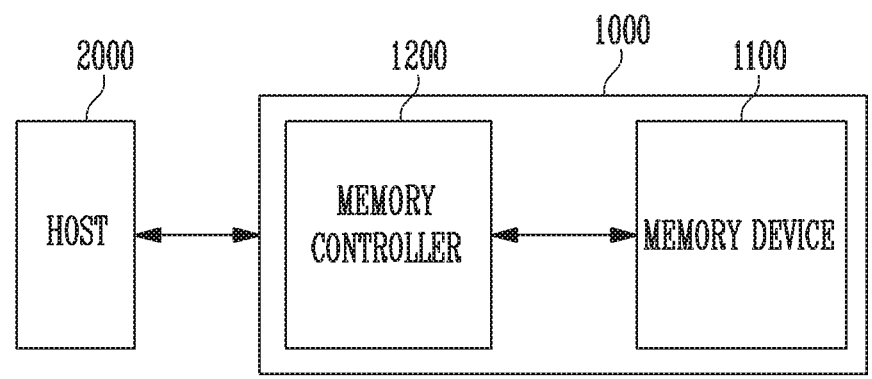
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a memory device 1100 that stores data and a memory controller 1200 that controls the memory device 1100 under the control of a host 2000.

The host 2000 may communicate with the memory system 1000 by using an interface protocol such as peripheral component interconnect-express (PCI-E), advanced technology attachment (ATA), serial ATA (SATA), parallel ATA (PATA), or serial attached SCSI (SAS). In addition, interface protocols between the host 2000 and the memory system 1000 are not limited to the above-described examples, and may be one of other interface protocols such as a universal serial bus (USB), a multi-media card (MMC), an enhanced small disk interface (ESDI), and integrated drive electronics (IDE).

The memory controller 1200 may control the overall operations of the memory system 1000, and control data exchange between the host 2000 and the memory device 1100. For example, the memory controller 1200 may program or read data by controlling the memory device 1100 in response to a request of the host 2000. Also, the memory controller 1200 may store information into main memory blocks and sub-memory blocks, which are included in the memory device 1100. The memory controller may selectively perform a program operation on a main memory block or a sub-memory block of the memory device 1100 according to the amount of data loaded for the program operation. In some embodiments, the memory device 1100 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory.

The memory device 1100 may perform a program, read or erase operation under the control of the memory controller 1200.

Figure 2:
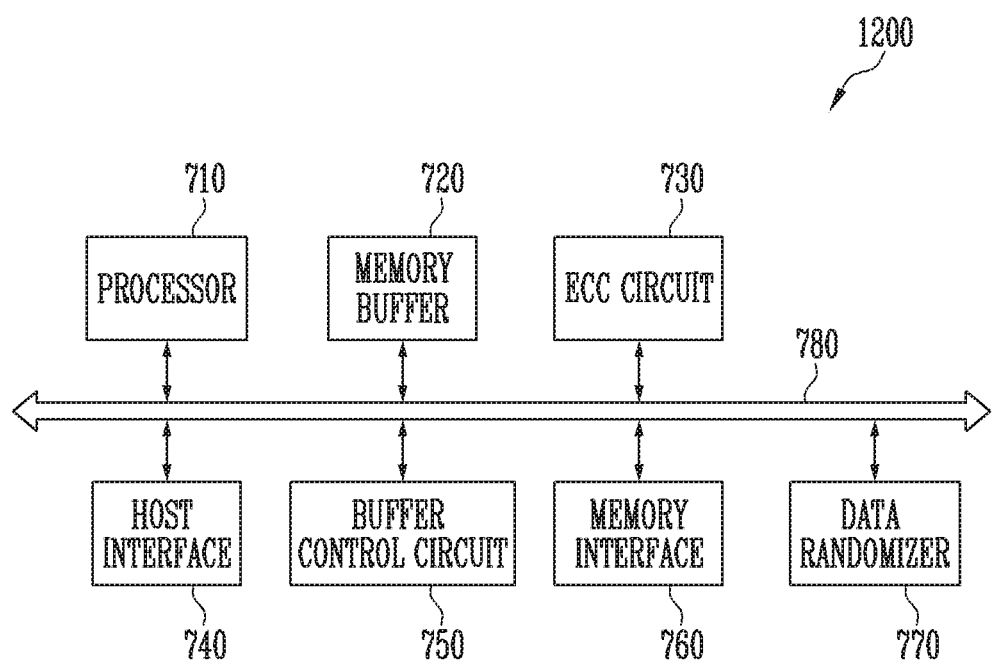
FIG. 2 is a diagram illustrating an exemplary configuration of a memory controller shown in FIG. 1.

FIG. 2 is a diagram illustrating the memory controller of FIG. 1.

Referring to FIG. 2, the memory controller 1200 may include a processor 710, a memory buffer 720, an error correction code (ECC) circuit 730, a host interface 740, a buffer control circuit 750, a memory interface 760, a data randomizer 770 and a bus 780.

The bus 780 may be configured to provide one or more channels between the components of the memory controller 1200.

The processor 710 may control the overall operations of the memory controller 1200, and perform a logical operation. The processor 710 may communicate with the external host 2000 through the host interface 740, and communicate with the memory device 1100 through the memory interface 760. Also, the processor 710 may communicate with the memory buffer 720 through the buffer control circuit 750. The processor 710 may control an operation of the memory system 1000 by using the memory buffer 720 as a working memory, a cache memory, or a buffer memory.

The processor 710 may queue a plurality of commands received from the host 2000. Such an operation is referred to as a multi-queueing operation or multi-queueing. In a multi-queueing operation, a queued command is referred to as a tag or a queued tag. The processor 710 may sequentially transfer a plurality of queued tags to the memory device 1100. Also, the processor 710 may a plurality of queued tags, of which sequence is changed, to the memory device 1100. In other words, the processor 710 may use various methods including order of priority, cross reference, and the like in order to efficiently process the queued tags.

The memory buffer 720 may be used as the working memory, the cache memory, or the buffer memory of the processor 710. The memory buffer 720 may store codes (program code, and data) and commands, which are executed by the processor 710. Suitable examples of the memory buffer 720 may include a static RAM (SRAM) or a dynamic RAM (DRAM).

The ECC circuit 730 may perform an ECC operation. The ECC circuit 730 may perform ECC encoding on data to be written in the memory device 1100. The ECC encoded data may be transferred to the memory device 1100 through the memory interface 760. The ECC circuit 730 may also perform ECC decoding on data received from the memory device 1100. The ECC circuit 730 may receive data from the memory device 1100 through the memory interface 760. In an embodiment, the ECC circuit 730 may be a component of the memory interface 760.

The host interface 740 is configured to communicate with the external host 2000 under the control of the processor 710. The host interface 740 may be implemented as at least one of a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM) and the like.

The buffer control circuit 750 is configured to control the memory buffer 720 under the control of the processor 710.

The memory interface 760 is configured to communicate with the memory device 1100 under the control of the processor 710. The memory interface 760 may communicate a command, an address, and data with the memory device 1100 through one or more channels of the bus 780.

In a variation of the illustrated embodiment of FIG. 2, the memory controller 1200 may not include the memory buffer 720 and the buffer control circuit 750. The processor 710 may load codes from a nonvolatile memory device (e.g., a read only memory (ROM)) provided inside the memory controller 1200. As another example, the processor 710 may load codes from the memory device 1100 through the memory interface 760.

The data randomizer 770 may randomize data or de-randomize the randomized data. The data randomizer 770 may perform a data randomizing operation on data to be written in the memory device 1100. The randomized data may be transferred to the memory device 1100 through the memory interface 760. The data randomizer 770 may also perform a data de-randomizing operation on data received from the memory device 1100 through the memory interface 760. In a variation of the illustrated embodiment of FIG. 2, the data randomizer 770 may be included as a component of the memory interface 760.

In an embodiment, the bus 780 of the memory controller 1200 may be divided into a control bus and a data bus. The data bus may be configured to transmit data in the memory controller 1200, and the control bus may be configured to transmit control information such as a command and an address in the memory controller 1200. The data bus and the control bus are separated from each other, and may not interfere or influence with each other. The data bus may be coupled to the host interface 740, the buffer control circuit 750, the ECC circuit 730, and the memory interface 760. The control bus may be coupled to the host interface 740, the processor 710, the buffer control circuit 750, the memory buffer 720, and the memory interface 760.

Figure 3:
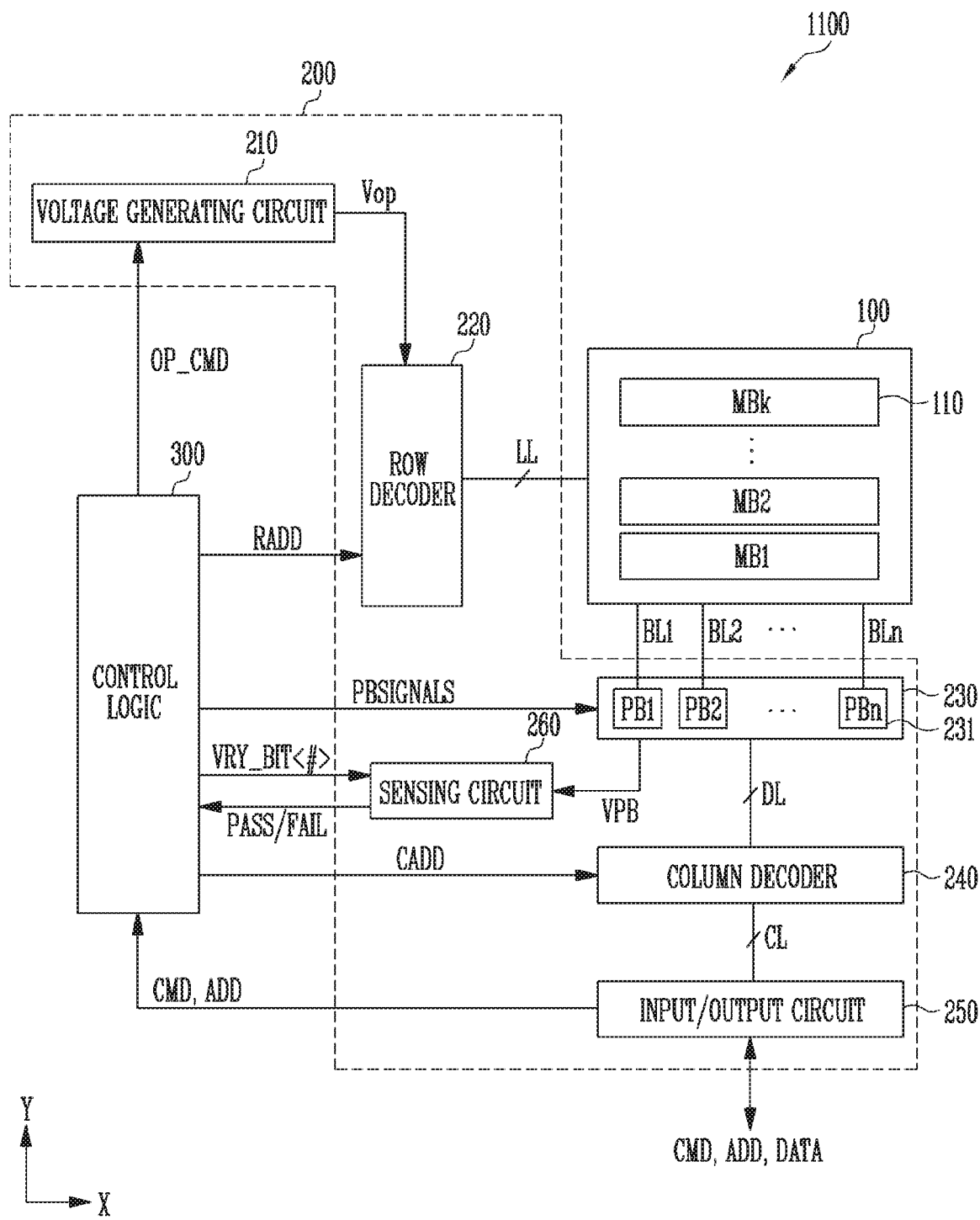
FIG. 3 is a diagram illustrating an exemplary configuration of a memory device shown in FIG. 1.

FIG. 3 is a diagram illustrating the memory device of FIG. 1.

Referring to FIG. 3, the memory device 1100 may include a memory cell array 100 that stores data. The memory device 1100 may include peripheral circuits 200 configured to perform a program operation for storing data in the memory cell array 100, a read operation for outputting the stored data, and an erase operation for erasing the stored data. The memory device 1100 may include a control logic 300 that controls the peripheral circuits 200 under the control of the memory controller 1200 of FIG. 1.

The memory cell array 100 may include a plurality of memory blocks MB1 to MBk 110, wherein k is a positive integer. Local lines LL and bit lines BL1 to BLn, wherein n is a positive integer, may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuits 200 may be configured to perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled to a selected word line among the word lines. For example, the peripheral circuits 200 may include a voltage generating circuit 210, a row decoder 220, a page buffer group 230, a column decoder 240, an input/output circuit 250, and a sensing circuit 260.

The voltage generating circuit 210 may generate various operating voltages Vop used for program, read, and erase operations in response to an operation signal OP_CMD received from the control logic 300. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD received from the control logic 300.

The page buffer group 230 may include a plurality of page buffers PB1 to PBn 231 coupled to the bit lines BL1 to BLn. For example, each page buffer PB1 to PBn 231 may be coupled to a corresponding bit line among the plurality of bit lines BL1 to BLn. The page buffers PB1 to PBn 231 may operate in response to page buffer control signals PBSIG-NALS received from the control logic 300. The page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD received from the control logic 300. For example, the column decoder 240 may exchange data with the page buffers 231 through data lines DL, or exchange data with the input/output circuit 250 through column lines CL.

The input/output circuit 250 may transfer a command CMD and address ADD, which are received from the memory controller (1200 of FIG. 1), to the control logic 300, or exchange data DATA with the column decoder 240.

The sensing circuit 260, in a read operation and a verify operation, may generate a reference current in response to a permission bit VRY_BIT<#>, and output a pass signal PASS or a fail signal FAIL by comparing a sensing voltage VPB received from the page buffer group 230 with a reference voltage generated by the reference current.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

Figure 4:
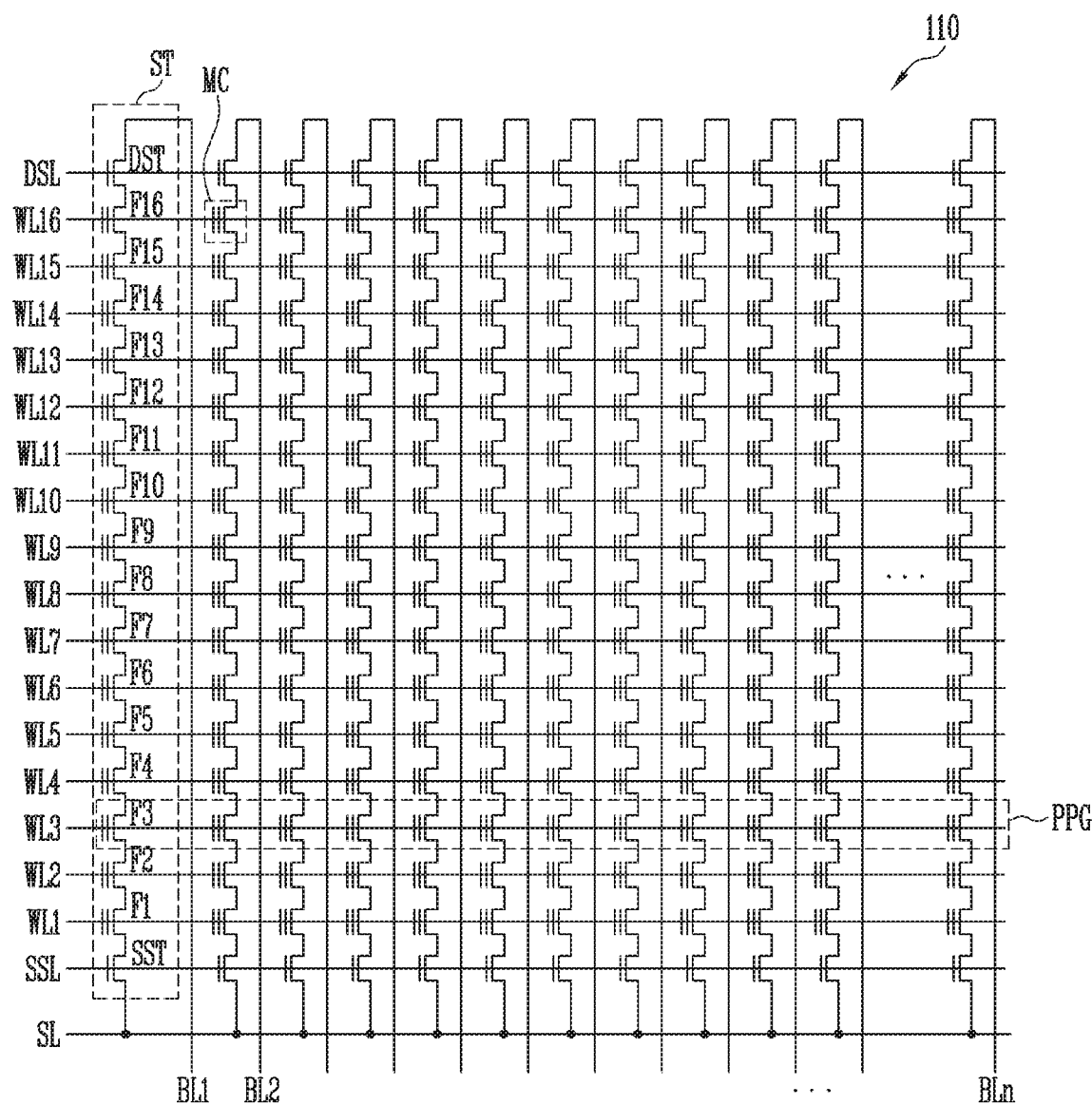
FIG. 4 is a diagram illustrating an exemplary configuration of a memory block shown in FIG. 3.

FIG. 4 is a diagram illustrating an exemplary configuration of the memory block of FIG. 3.

Referring to FIG. 4, a plurality of word lines arranged in parallel to one another between a first select line and a second select line may be coupled to the first memory block 110. Here, the first select line may be a source select line SSL, and the second select line may be a drain select line DSL. More specifically, the first memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST. Also, the number of memory cells included in one string ST may vary by design and may be larger than the number of the memory cells F1 to F16 shown in FIG. 4.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, physical pages PPG the number of which corresponds to the number of the word lines WL1 to WL16 may be included in the first memory block 110.

In an embodiment, each memory cell MC may store one bit of data, i.e., may be a single level cell (SLC). In this case, one physical page PPG may store one logical page (LPG) data. The one LPG data may include data bits the number of which corresponds to the number of cells included in one physical page PPG. In another embodiment, each memory cell MC may store two or more bits of data, i.e., may be a multi-level cell. In this case, one physical page PPG may store two or more LPG data.

Figure 5:
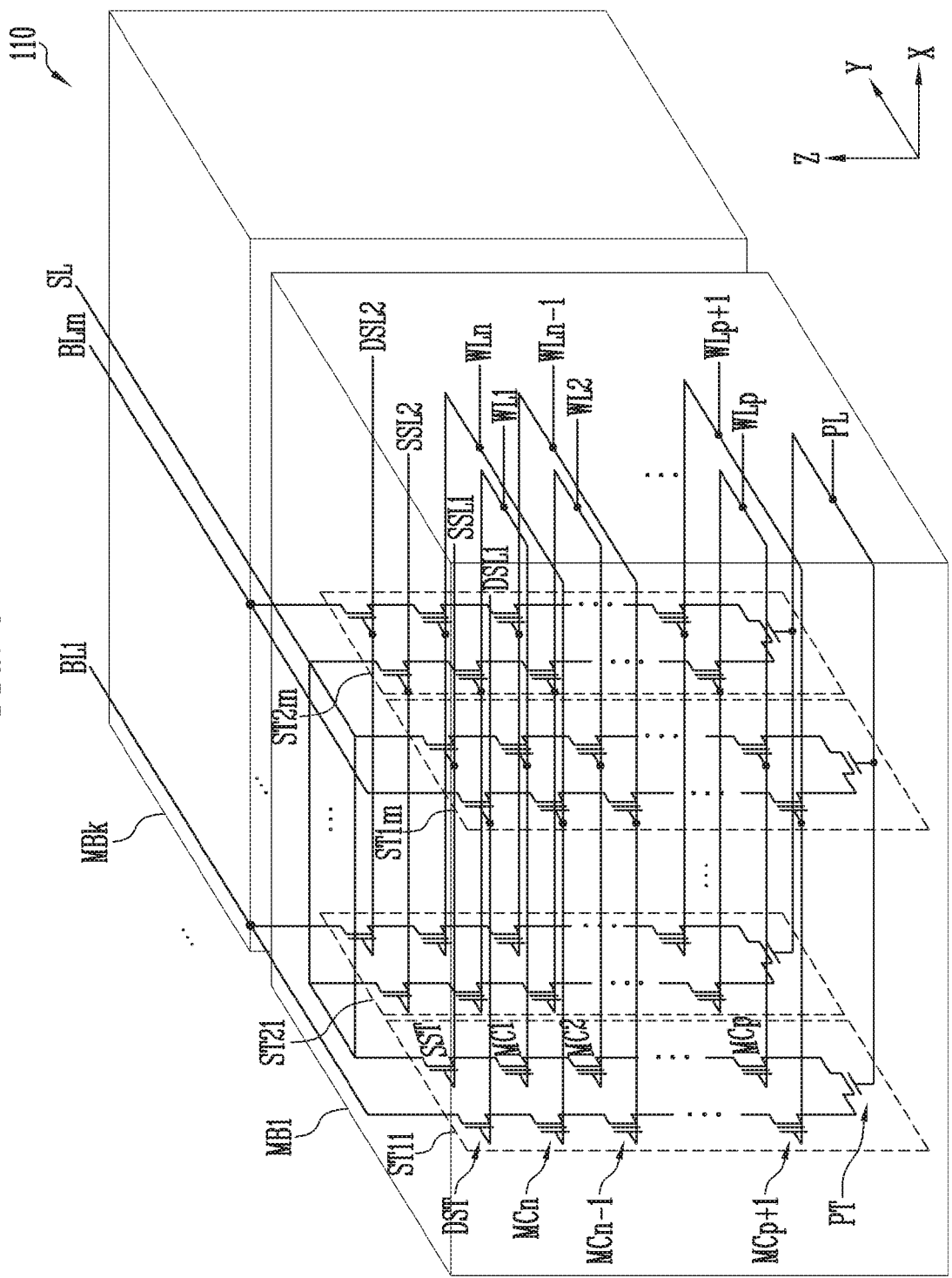
FIG. 5 is a diagram illustrating an embodiment of a memory block that is three-dimensionally configured.

FIG. 5 is a diagram illustrating an embodiment of a memory block that is three-dimensionally configured.

Referring to FIG. 5, the memory cell array 100 may include a plurality of memory blocks MB1 to MBk 110. The memory block 110 may include a plurality of strings ST11 to ST1m and ST21 to ST2m. In an embodiment, each of the plurality of strings ST11 to ST1m and ST21 to ST2m may be formed in a 'U' shape. In the memory block 110, m strings may be arranged in a row direction (X direction). In FIG. 5, it is illustrated that two strings are arranged in a column direction (Y direction), However, this is for convenience of description, and three or more strings may be arranged in the column direction (Y direction).

Each of the plurality of strings ST11 to ST1m and ST21 to ST2m may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 5, source select transistors of strings ST11 to ST1m of a first row may be coupled to a first source select line SSL1. Source select transistors of strings ST21 to ST2m of a second row may be coupled to a second source select line SSL2.

In another embodiment, the source select transistors of the strings ST11 to ST1m and ST21 to ST2m may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1m, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 5, strings ST11 and ST21 of a first column may be coupled to a first bit line BL1. Strings ST1m and ST2m of an mth column may be coupled to an mth bit line BLm.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. As any one of the drain select lines DSL1 and DSL2 is selected, strings arranged in one row direction may be selected. As any one of the word lines WL1 to WLn is selected, one page among the selected strings may be selected.

Figure 6:
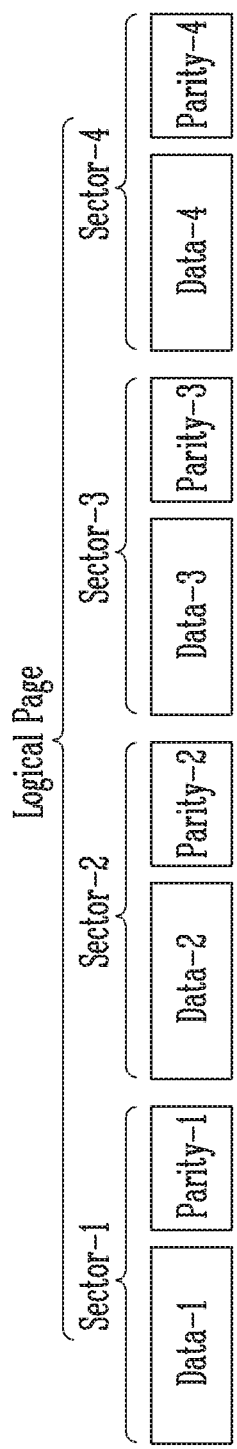
FIG. 6 is a diagram illustrating an example of data of a logical page comprising a plurality of data sectors.

FIG. 6 is a diagram illustrating an example of data of a logical page comprising a plurality of data sectors.

Referring to FIG. 6, data of one logical page (LPG) or an LPG data may be configured with a plurality of data sectors. The LPG data may be ECC encoded by the ECC circuit 730 before provided to the memory device 1100. The ECC encoding may be performed by providing a parity bit to data and encoding the data together with the parity bit. The ECC encoded data may be programmed together with the parity bit in a physical page PPG.

The ECC encoded data programmed together with the parity bit in the physical page PPG may be read from the memory device 1100 by a read operation to be output to the memory controller 1200. The ECC encoded data output from the memory device 1100 to the memory controller 1200 may be ECC decoded by the ECC circuit 730 of the memory controller 1200. The ECC decoding may be an operation of correcting an error of the ECC encoded data by using the parity bit included in the ECC encoded data.

One LPG data may be divided into a plurality of data sectors, and each data sector may be independently ECC encoded by the ECC circuit 730. In other words, each data sector may be configured with ECC-encoded data and a parity bit. That is, the ECC encoding may be performed by providing a parity bit to each data sector. As an example, one LPG data may be configured with first to fourth data sectors Sector-1 to Sector-4. Each of the data sectors may include user data and corresponding parity, which are ECC encoded. The first data sector Sector-1 may include first user data Data-1 and a first parity Parity-1 added to the first user data Data-1, which are ECC encoded. The second data sector Sector-2 may include second user data Data-2 and a second parity Parity-2 added to the second user data Data-2, which are ECC encoded. The third data sector Sector-3 may include third user data Data-3 and a third parity Parity-3 added to the third user data Data-3, which are ECC encoded. The fourth data sector Sector-4 may include fourth user data Data-4 and a fourth parity Parity-4 added to the fourth user data Data-4, which are ECC encoded.

The memory device 1100 may read one LPG data when a read command is received and store the read LPG data in the page buffer group 230. Also, the memory device 1100 may output the LGP data stored in the page buffer group 230 in response to a data output command. At this time, only the data of some data sectors among the data of a plurality of data sectors included in one logical page may be sent to the host 2000. As an example, when the memory device 1100 outputs first data sector Sector-1, the ECC circuit 730 of the memory controller 1200 may perform ECC decoding by using the first user data Data-1 and the first parity Parity-1. Then, the ECC decoded data sector may be sent to the host 2000. In other words, a read operation of the memory device 1100 may be performed in units of logical pages, and a data output operation of the memory device 1100 may be performed in units of data sectors.

Figure 7:
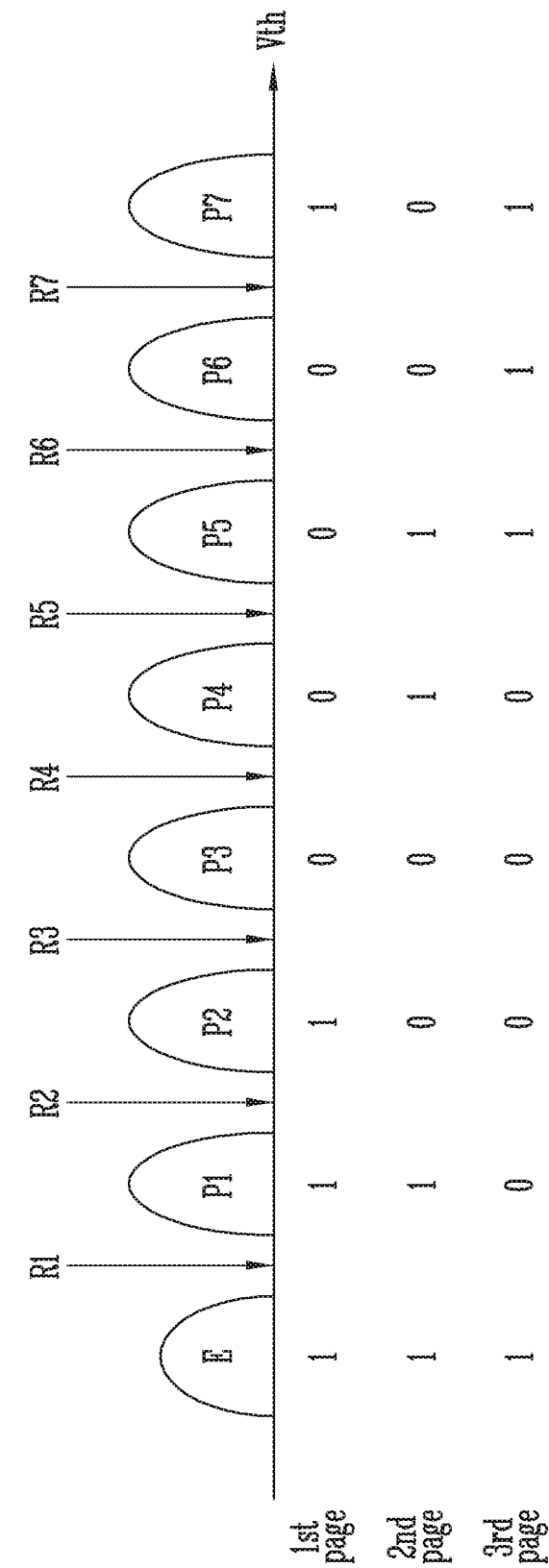
FIG. 7 is a diagram illustrating threshold voltage distributions of multi-bit memory cells and a read operation, in accordance with an embodiment of the present disclosure.

FIG. 7 is a diagram illustrating threshold voltage distributions of multi-bit memory cells and a read operation, according to an embodiment of the present disclosure.

Referring to FIG. 7, one memory cell may store 2 or more bits of data. As an example, the memory cell may store 3 bits of data. In this case, one physical page PPG may store three LPG data of first to third pages 1st logical page, 2nd logical page, and 3rd logical page. The three LPG data stored in the first to third logical pages may form eight threshold voltage distributions. In other words, the three LPG data stored in the first to third logical pages may form an erase threshold voltage distribution E and first to seventh program threshold voltage distributions P1 to P7. Each threshold voltage distribution may correspond to data of 3 bits. For example, the erase threshold voltage distribution E may correspond to '111,' and the first program threshold voltage distribution P1 may correspond to '110.' At this time, '110' are a first logical page data bit, a second logical page data bit, and a third logical page data bit, respectively. The second program threshold voltage distribution P2, the third program threshold voltage distribution P3, the fourth program threshold voltage distribution P4, the fifth program threshold voltage distribution P5, the sixth program threshold voltage distribution P6, and the seventh program threshold voltage distribution P7 may correspond to '100,' '000,' '010,' '011,' '001,' and '101,' respectively.

When a read command and a read address corresponding to first LPG data are received, the memory device 1100 may perform a read operation, using a third read voltage R3 and a seventh read voltage R7. When a read command and a read address corresponding to second LPG data are received, the memory device 1100 may perform a read operation, using a second read voltage R2, a fourth read voltage R4, and a sixth read voltage R6. When a read command and a read address corresponding to third LGP data are received, the memory device 1100 may perform a read operation, using a first read voltage R1 and a fifth read voltage R5.

Data may be randomized by the data randomizer 770 of the memory controller 1200 to be programmed in the physical page PPG. When the data is randomized, numbers of memory cells included in the erase threshold voltage distribution E and the first to seventh program threshold voltage distributions P1 to P7 may be equal to one another or be substantially equal to one another. As an example, when a read operation is performed using the first read voltage R1, the number of on-cells and the number of off-cells may be formed at a ratio of 1:7. As another example, when a read operation is performed using the third read voltage R3, the number of on-cells and the number of off-cells may be formed at a ratio of 3:4. For example, when the ratio of the number of on-cells to the number of off-cells is 3.2:18 as a result obtained by performing the read operation, using the third read voltage R3, i.e., when the number of on-cells increases with reference to a reference value (i.e., the ratio of 3:4), it may be presumed that the threshold voltage distribution has been entirely moved to the left side. In other words, the optimum third read voltage R3 may be a voltage smaller than the initially set third read voltage R3. When the threshold voltage distribution is entirely moved as time elapses after the data is programmed, the ratio of the number of on-cells to the number of off-cells may not be a reference value (e.g., the ratio of 3:4) when a read operation is performed using the initially set third read voltage R3. In this case, the optimum third read voltage R3 may be set as a read voltage at which the ratio of the number of on-cells to the number of off-cells is exactly or close to the reference value (i.e., the ratio of 3:4).

As another example, when a read operation is performed using the sixth read voltage R6, the number of on-cells and the number of off-cells may form a ratio of 6:2. For example, when the ratio of the number of on-cells to the number of off-cells is 5.7:2.3 as a result obtained by performing the read operation using the sixth read voltage R6, it may be presumed that the threshold voltage distribution has been entirely moved to the right side. In other words, the optimum sixth read voltage R6 may be a voltage larger than the initially set sixth read voltage R6.

Figure 8:
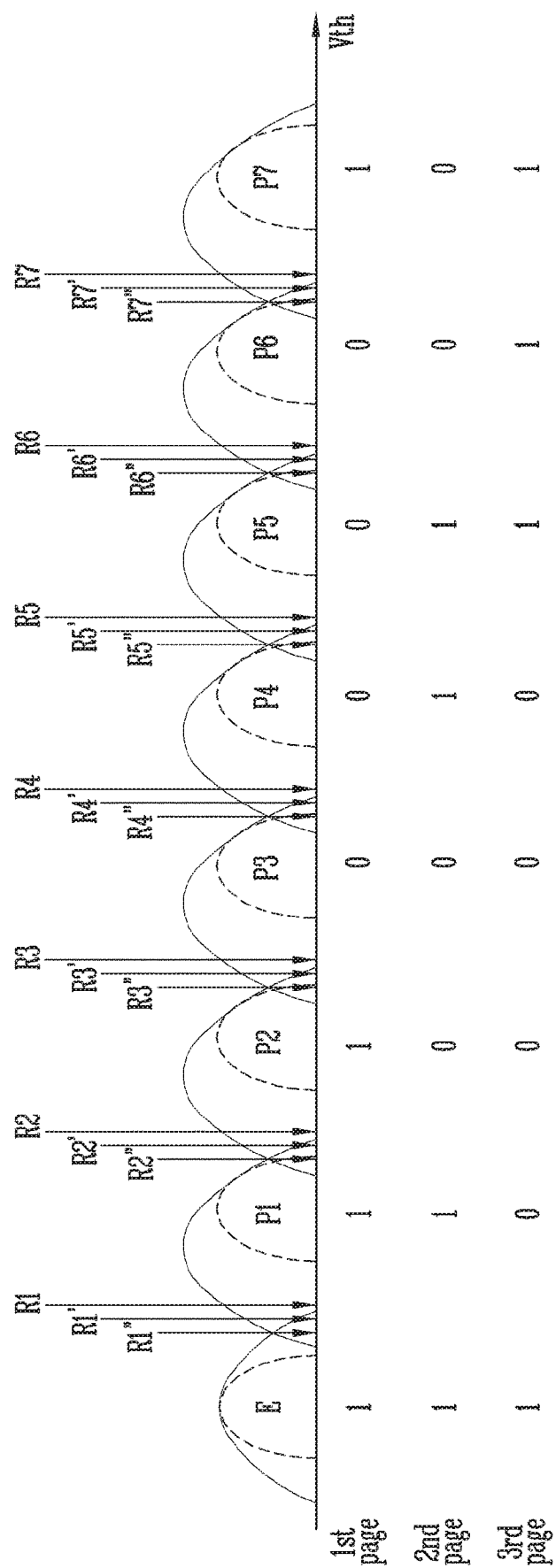
FIG. 8 is a diagram illustrating a method for performing a defense code operation in accordance with an embodiment of the present disclosure.

FIG. 8 is a diagram illustrating a method for performing a defense code operation, according to an embodiment of the present disclosure.

Referring to FIG. 8, if time elapses after a program operation is performed, the threshold voltage distribution of memory cells may be widened as compared with that just after the program operation is performed. As a result, adjacent threshold voltage distributions may overlap with each other as shown in FIG. 8. As a result, when a read operation is performed using initially set read voltages, i.e., first to seventh read voltages R1 to R7, a plurality of error bits may be included in read data. In this case, an ECC operation performed by the ECC circuit 730 of the memory controller 1200 may fail.

When the ECC operation performed by the ECC circuit 730 fails, the memory device 1100 may perform a read retry operation, using read voltages R1' to R7' that are changed by a certain offset from the initially set voltages, i.e., the first to seventh read voltages R1 to R7. As an example, in the case of a second LPG data read operation, the memory device 1100 may first perform the read operation, using the second read voltage R2, the fourth read voltage R4, and the sixth read voltage R6. When an ECC operation performed by the ECC circuit 730 of the memory controller 1200 fails with respect to read data read by the read operation performed using the second read voltage R2, the fourth read voltage R4, and the sixth read voltage R6, the memory device 1100 may perform a read operation, using a second read voltage R2', a fourth read voltage R4', and a sixth read voltage R6', which are changed by a certain offset. Offset voltages between the second, fourth, and sixth read voltages R2, R4, and R6 and the changed second, fourth, and sixth read voltages R2', R4', and R6' may be different from one another. Also, the offset voltages between the second, fourth, and sixth read voltages R2, R4, and R6 and the changed second, fourth, and sixth read voltages R2', R4', and R6° may be inputted in the form of digital code values by the memory controller 1200. When the ECC operation on the read data read by the read operation performed using the first to seventh read voltages R1 to R7 fails, a read operation using a changed bias condition, which is subsequently performed, is referred to as a read retry operation.

When an ECC operation on data output by the read retry operation performed using the changed first to seventh read voltages to R7' again fails, the memory device 1100 may again change the read voltages R1' to R7' and perform a read retry operation, using the changed read voltages, i.e., first to seventh read voltages R1" to R7".

As another example, in the case of the second LPG data read operation, the memory device 1100 may first perform the read operation, using the second read voltage R2, the fourth read voltage R4, and the sixth read voltage R6. When an ECC operation performed by the ECC circuit 730 of the memory controller 1200 fails with respect to read data read by the read operation performed using the second read voltage R2, the fourth read voltage R4, and the sixth read voltage R6, the memory system 1000 may start an optimum read voltage search operation. If data is randomized to be programmed in memory cells as described with reference to FIG. 7, an optimum second read voltage may be a read voltage at which the ratio of the number of on-cells to the number of off-cells is the reference value (i.e., the ratio of 2:6). The memory system 1000 may perform the optimum read voltage search operation by using such a feature. In other words, when a read voltage at which the ratio of the number of on-cells to the number of off-cells is the reference value (e.g., the ratio of 2:6) is searched while gradually changing the second read voltage R2, the searched read voltage may be set as the optimum second read voltage. An optimum fourth read voltage may be searched by performing the same operation as the second read voltage on the fourth read voltage R4. In other words, a read voltage at which the ratio of the number of on-cells to the number of off-cells is the reference value (i.e., the ratio of 4:4) may be set as the optimum fourth read voltage. In addition, an optimum sixth read voltage may be searched by performing the same operation as the second read voltage on the sixth read voltage R4. In other words, a read voltage at which the ratio of the number of on-cells to the number of off-cells is the reference value (i.e., the ratio of 6:2) may be set as the optimum sixth read voltage. The second LPG data read retry operation may be performed using the optimum second read voltage, the optimum fourth read voltage, and the optimum sixth read voltage, which are set in this manner. The above-described optimum read voltage search operation and the read retry operation performed using the searched optimum read voltages are referred to as a defense code operation.

As described above, the defense code operation may require a plurality of read operations. As a result, much time may be taken, which results in an increase in read latency. Accordingly, there is required a method for performing a defense code operation, which can decrease the number of times of read operations. As an example, when the ratio of the number of on-cells to the number of off-cells is 3:5 as a reference value obtained by performing a read operation using the initially set second read voltage and the ratio of the number of on-cells to the number of off-cells is 2.5:4.5 as a result obtained by performing a read operation using the second read voltage changed by a certain offset in the search of the optimum second read voltage, the optimum second read voltage can be immediately predicted from a difference between the two voltages, i.e., an offset and a change in ratio of the number of on-cells to the number of off-cells between the two operations. In other words, the number of times of read operations for searching for the optimum read voltage can be decreased by deriving the optimum read voltage from a difference in read voltages between two read operations and a change in the number of memory cells, i.e., an inclination.

When an ECC operation on the second LPG data succeeds as the above-described defense code operation is performed, a result of the defense code operation on the second LPG data read operation may be used in a first LPG data read retry operation or third LPG data read retry operation of the same physical page. As an example, a read voltage in the first LPG data read retry operation may be determined based on the optimum second read voltage, the optimum fourth read voltage, or the optimum sixth read voltage, which is searched in the defense code operation on the second LPG data read operation. A first LPG data read operation may be performed using the third read voltage R3, and the seventh read voltage R7. At this time, a difference between the optimum third read voltage and the initially set third read voltage may be similar to a difference between the optimum second read voltage and the initially set second read voltage, a difference between the optimum fourth read voltage and the initially set fourth read voltage, or a difference between the optimum sixth read voltage and the initially set sixth read voltage. Thus, the defense code operation performed on the second LPG data read operation, e.g., a result obtained by searching for the optimum second read voltage, the optimum fourth read voltage, or the optimum sixth read voltage can be used to search for the optimum third read voltage or the optimum seventh read voltage. As a result, it is possible to decrease the time required to search for the optimum third read voltage or the optimum seventh read voltage.

When the ECC operation on the second LPG data programmed in a first physical page succeeds as the above-described defense code operation is performed, a result of the defense code operation on a second LPG data read operation of the first physical page may be used in first to third LPG data read operations of a second physical page different from the first physical page. In this case, the first physical page and the second physical page may be included in the same memory block 110. Data stored in a plurality of physical pages included in one memory block 110 may experience read disturbs similar to one another. As a result, movements of threshold voltage distributions of data stored in a plurality of physical pages included in one memory block 110 may be similar to one another. Thus, when the ECC operation on the second LPG data programmed in the first physical page succeeds as the above-described defense code operation is performed, the optimum read voltages used in the first to third LPG data read operations of the second physical page can be rapidly searched when a result of the defense code operation on the second LPG data read operation of the first physical page is used in the first to third LPG data read operations of the second physical page different from the first physical page.

As another example, when the ECC operation on first data sector in the second LPG data succeeds as the above-described defense code operation is performed, a result of the defense code operation on a first data sector read operation may be used in another data sector read operation or defense code operation on another data sector in the same LPG data, i.e., the second LPG data. For example, the optimum second read voltage, the optimum fourth read voltage, or the optimum sixth read voltage, which is searched in the defense code operation on the first data sector of the second LPG data may be used in the second data sector read operation or read retry operation on the second data sector in the second LPG data. As a result, the time required to perform the defense code operation on the second data sector is decreased, so that it is possible to decrease read latency.

Figure 9:
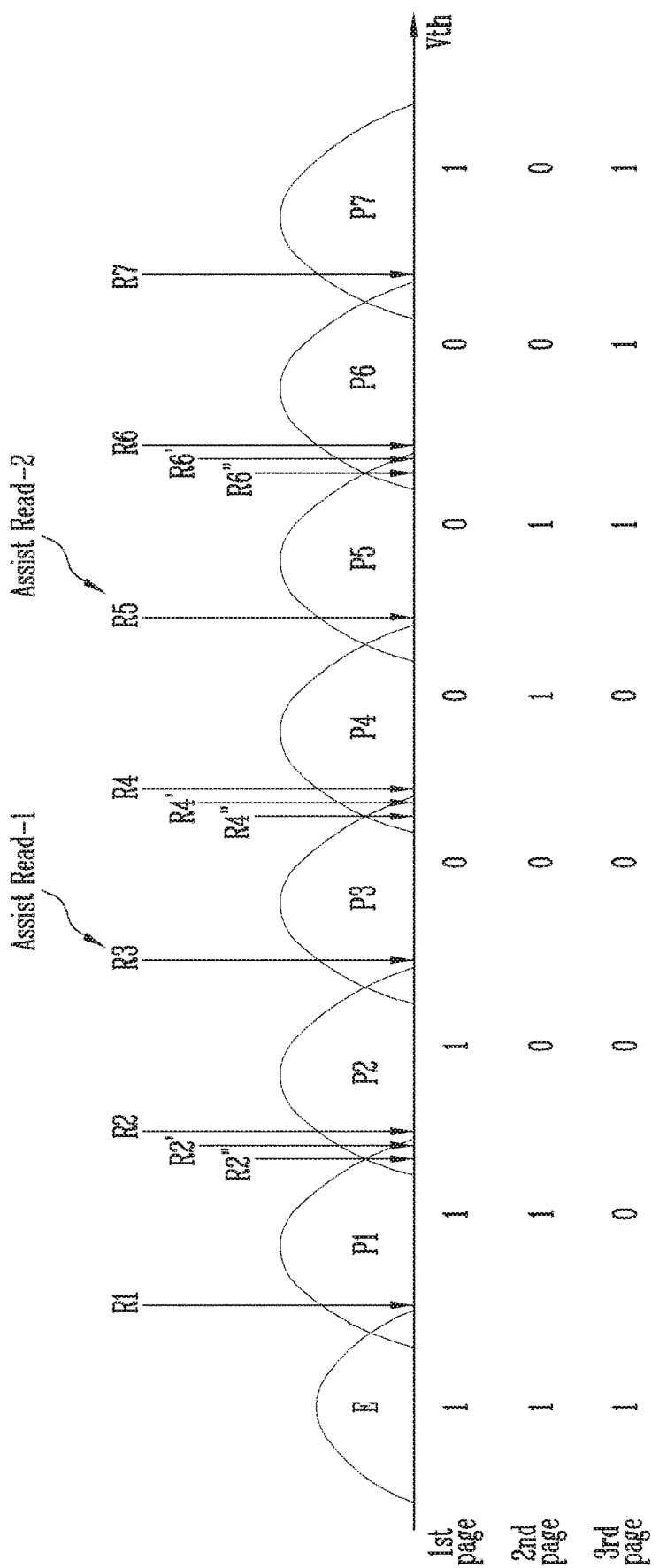
FIG. 9 is a diagram illustrating a method for performing a defense code operation in accordance with embodiment of the present disclosure.

FIG. 9 is a diagram illustrating a method for performing a defense code operation, according to another embodiment of the present disclosure.

Referring to FIG. 9, an assist read operation may be performed to rapidly search for the optimum read voltage during the defense code operation. For example, a first assist read operation Assist read-1 using the third read voltage R3 and a second assist read operation Assist read-2 using the fifth read voltage R5 may be performed when a second LPG data read operation is performed using the second read voltage R2, the fourth read voltage R4, and the sixth read voltage R6. The operation of searching for the optimum read voltage can be more rapidly performed through such assist read operations.

As an example, when the ECC operation of the second LPG data read operation using the second, fourth and sixth read voltages R2, R4, and R6 fails, the defense code operation may be performed to the second LPG data by using a read operation using changed second, fourth and sixth read voltages R2', R4', and R6' and two-time assist read operations using the third and fifth read voltages R3 and R5. When the read operation is performed to the second LPG data using the changed second, fourth and sixth read voltages R2', R4', and R6', data of one bit such as '1' or '0' may be extracted per each memory cell. Referring to FIG. 7, when the data of one bit, which is read from a memory cell in the second LPG data, is '1' as the read operation is performed to the second LPG data using the changed second, fourth and sixth read voltages R2', R4', and R6', the memory cell may be included in any one between the erase threshold voltage distribution E and the first program threshold voltage distribution P1 or any one between the fourth program threshold voltage distribution P4 and the fifth program threshold voltage distribution P5. At this time, in the case of a memory cell of the second LPG data determined as an on-cell as a result of the first assist read operation Assist read-1 with the third read voltage R3, the corresponding memory cell may be determined as a memory cell included in the erase threshold voltage distribution E or the first program threshold voltage distribution P1. On the contrary, in the case of a memory cell of the second LPG data determined as an off-cell as a result of the first assist read operation Assist read-1 with the third read voltage R3, the corresponding memory cell may be determined as a memory cell included in the fourth program threshold voltage distribution P4 or the fifth program threshold voltage distribution P5. In other words, the memory cell that has data of '1°' as the result of the read operation performed to the second LPG data using the changed second, fourth and sixth read voltages R2', R4', and R6' and is determined as an on-cell as a result of the first assist read operation Assist read-1 with the third read voltage R3 may be determined as a memory cell included in the erase threshold voltage distribution E or the first program threshold voltage distribution P1. In this case, a second read voltage at which the ratio of the number of memory cells, each of which has data of '1' as the result of the read operation performed to the second LPG data using the changed second, fourth and sixth read voltages R2', R4', and R6' and is determined as an on-cell as a result of the first assist read operation Assist read-1 with the third read voltage R3, to the number of the other memory cells is the reference value (i.e., the ratio of 2:6) may be set as the optimum second read voltage. When the ratio of the number of memory cells, each of which has data of '1' as the result of the read operation performed to the second LPG data using the changed second, fourth and sixth read voltages R2', R4', and R6' and is determined as an on-cell as a result of the first assist read operation Assist read-1 with the third read voltage R3, to the number of the other memory cells is 2.2:5.8, the optimum second read voltage may be a voltage smaller than the changed second read voltage R2'.

As an example, when the data of one bit, which is read from a memory cell in the second LPG data, is '1' as the second LPG data read operation is performed using the changed second, fourth and sixth read voltages R2', R4', and R6', the memory cell may be included in any one between the erase threshold voltage distribution E and the first program threshold voltage distribution P1 or any one between the fourth program threshold voltage distribution P4 and the fifth program threshold voltage distribution P5. At this time, in the case of a memory cell of the second LPG data determined as an off-cell as a result of the first assist read operation Assist read-1 with the third read voltage R3, the corresponding memory cell may be determined as a memory cell included in the fourth program threshold voltage distribution P4 or the fifth program threshold voltage distribution P5. In other words, a fourth read voltage at which the ratio of the number of memory cells, each of which has data of '1' as the result of the read operation performed to the second LPG data using the changed second, fourth and sixth read voltages R2', R4', and R6' and is determined as an off-cell as a result of the first assist read operation Assist read-1 with the third read voltage R3, to the number of the other memory cells is the reference value (i.e., the ratio of 2:6) may be set as the optimum fourth read voltage.

As an example, when the data of one bit, which is read from a memory cell in the second LPG data, is '0' as the second LPG data read operation is performed using the changed second, fourth and sixth read voltages R2', R4', and R6', the memory cell may be included in any one between the second program threshold voltage distribution P2 and the third program threshold voltage distribution P3 or any one between the sixth program threshold voltage distribution P6 and the seventh program threshold voltage distribution P7. At this time, in the case of a memory cell of the second LPG data determined as an on-cell as a result of the second assist read operation Assist read-2 with the fifth read voltage R5, the corresponding memory cell may be determined as a memory cell included in the second program threshold voltage distribution P2 or the third program threshold voltage distribution P3. On the contrary, in the case of a memory cell of the second LPG data determined as an off-cell as a result of the second assist read operation Assist read-2 with the fifth read voltage R5, the corresponding memory cell may be determined as a memory cell included in the sixth program threshold voltage distribution P6 or the seventh program threshold voltage distribution P7. In other words, the memory cell that has data of '0' as the result of the read operation performed to the second LPG data using the changed second, fourth and sixth read voltages R2', R4', and R6' and is determined as an off-cell as a result of the second assist read operation Assist read-2 with the fifth read voltage R5 may be determined as a memory cell included in the sixth program threshold voltage distribution P6 or the seventh program threshold voltage distribution P7. In other words, a fourth read voltage at which the ratio of the number of memory cells, each of which has data of '0' as the result of the read operation performed to the second LPG data using the changed second, fourth and sixth read voltages R2', R4', and R6' and is determined as an off-cell as a result of the second assist read operation Assist read-2 with the fifth read voltage R5, to the number of the other memory cells is the reference value (i.e., the ratio of 2:6) may be set as the optimum fourth read voltage. When the ratio of the number of memory cells, each of which has data of '0' as the result of the read operation performed to the second LPG data using the changed second, fourth and sixth read voltages R2', R4', and R6' and is determined as an off-cell as a result of the second assist read operation Assist read-2 with the fifth read voltage R5, to the number of the other memory cells is 2.2:5.8, the optimum sixth read voltage may be a voltage larger than the changed sixth read voltage R6'.

When the first and second assist read operations Assist read-1 and Assist read-2 are used as described above, it is unnecessary to individually perform operations of searching for the optimum second read voltage, the optimum fourth read voltage, and the optimum sixth read voltage. That is, data of one bit from each memory cell is read from each memory cell by performing the read operation once, using the second read voltage, the fourth read voltage, and the sixth read voltage, and the read data is compared with results of the first and second assist read operation, thereby searching for the optimum second read voltage, the optimum fourth read voltage, and the optimum sixth read voltage.

As another example, in a first LPG data read operation performed using the third read voltage and the seventh read voltage, the fifth read voltage R5 may be used in the assist read operation. Also, in a third LPG data read operation performed using the first read voltage and the fifth read voltage, the third read voltage R3 may be used in the assist read operation.

The optimum read voltage searched through the above-described operation may be used in another data sector read operation of the same logical page, another LPG read operation of the same physical page, or a read operation of logical pages programmed in another physical page of the same memory block. However, the use of the optimum read voltage is not necessarily limited to the above-described examples, and may be more variously applied.

Figure 10:
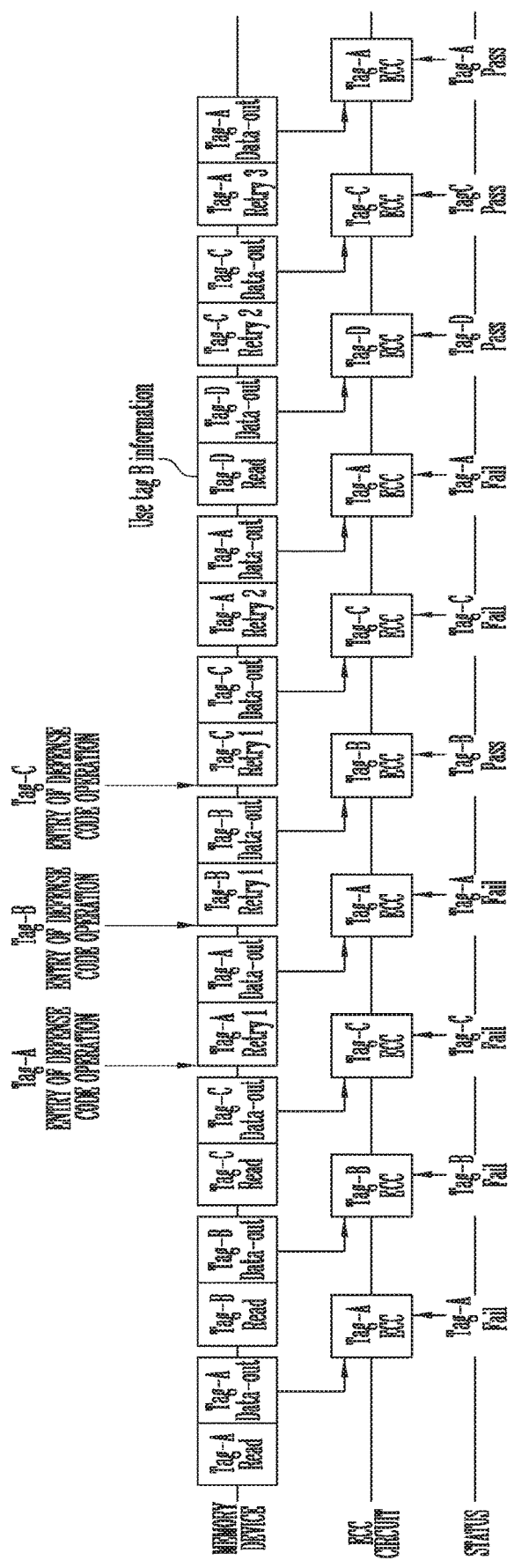
FIG. 10 is a diagram illustrating a method for performing a defense code operation between a plurality of tags in accordance with an embodiment of the present disclosure.

FIG. 10 is a diagram illustrating a method for performing a defense code operation between a plurality of tags, according to an embodiment of the present disclosure.

The memory controller 1200 may queue a plurality of commands received from the host 2000. Each of the plurality of commands queued by the memory controller 1200 is referred to as a tag. Each of the tags queued by the memory controller 1200 may correspond to a program operation, an erase operation, or a read operation. In addition, the tags queued by the memory controller 1200 may be sequentially transferred to the memory device 1100 to be performed. Before an operation on a tag first inputted to the memory device 1100 is completed, a next tag may be inputted. In addition, the tags queued by the memory controller 1200 may be transferred to the memory device 1100 in a sequence different from the queuing sequence to be performed. In other words, the memory controller 1200 may vary the sequence in which the queued tags are processed, using methods including order of priority, and the like.

Referring to FIG. 10, the memory device 1100 may first receive Tag-A Read command inputted from the memory controller 1200 and then perform a Tag-A read operation in response to the Tag-A Read command. After the Tag-A Read operation is completed, Tag-A data read through the Tag-A Read operation may be output (denoted as "Tag-A Data-out" in FIG. 10). The ECC circuit 730 of the memory controller 1200 may perform a Tag-A ECC operation on the Tag-A data. The Tag-A ECC operation on the Tag-A data may fail (denoted as "Tag-A Fail" in FIG. 10). While the ECC circuit 730 of the memory controller 1200 is performing the Tag-A ECC operation on the Tag-A data after the memory device 1100 outputs the Tag-A data ("Tag-A Data-out"), the memory controller 1200 may input Tag-B Read command to the memory device 1100, and perform a read operation in response to the Tag-B Read command. After Tag-B Read operation is completed, the memory device 1100 may output Tag-B data (denoted as "Tag-B Data-out" in FIG. 10) read through the Tag-B Read operation. The ECC circuit 730 of the memory controller 1200 may perform a Tag-B ECC operation on the Tag-B data. At this time, the Tag-B ECC operation on the Tag-B data may fail (denoted as "Tag-B Fail" in FIG. 10).

While the ECC circuit 730 of the memory controller 1200 is performing the Tag-B ECC operation on the Tag-B data after the memory device 1100 outputs the Tag-B data ("Tag-B Data-out"), the memory controller 1200 may input Tag-C Read command to the memory device 1100, and perform a read operation in response to the Tag-C read command. After Tag-C Read operation is completed, the memory device 1100 may output the Tag-C data (denoted as "Tag-C Data-out" in FIG. 10) read through the Tag-C Read operation. The ECC circuit 730 of the memory controller 1200 may perform a Tag-C ECC operation on the Tag-C data. At this time, the Tag-C ECC operation on the Tag-C data may fail (denoted as "Tag-C Fail" in FIG. 10).

While the ECC circuit 730 of the memory controller 1200 is performing the Tag-C ECC operation on the Tag-C data after the memory device 1100 outputs the Tag-C data, the memory controller 1200 may input Tag-A first read retry command Tag-A Retry1 to the memory device 1100, and the memory device 1100 may perform a read retry operation corresponding to the Tag-A read operation in response to the Tag-A first read retry command Tag-A Retry1, i.e., a defense code operation corresponding to the Tag-A read operation. In other words, the memory device 1100 enters into a defense code operation corresponding to the Tag-A read operation. Tag-A first read retry operation Tag-A Retry1 may be performed in a voltage condition different from that of the Tag-A read operation. In other words, the Tag-A first read retry operation Tag-A Retry1 may be performed using a new read voltage or an operation of searching for an optimum read voltage and a read retry operation using the optimum read voltage, i.e., a defense code operation, which are described with reference to FIG. 9.

After the Tag-A first read retry operation Tag-A Retry1 is completed, the Tag-A data output through the Tag-A first read retry operation Tag-A Retry1 may be output (denoted as "Tag-A Data-out" in FIG. 10). The ECC circuit 730 of the memory controller 1200 may perform a Tag-A ECC operation on the Tag-A data. The Tag-A ECC operation on the Tag-A data may fail (denoted as "Tag-A Fail" in FIG. 10).

While the ECC circuit 730 of the memory controller 1200 is performing the Tag-A ECC operation on the Tag-A data after the memory device 1100 outputs the Tag-A data ("Tag-A Data-out"), the memory controller 1200 may provide Tag-B first read retry command Tag-B Retry1 to the memory device 1100, and the memory device 1100 may perform a read retry operation corresponding to the Tag-B first read retry command Tag-B Retry1, i.e., a defense code operation corresponding to the Tag-B read operation. In other words, the memory device 1100 enters into a defense code operation corresponding to the Tag-B read operation. A Tag-B first read retry operation Tag-B Retry1 may be performed in a voltage condition different from that of the Tag-B read operation. In other words, the Tag-B first read retry operation Tag-B Retry1 may be performed using a new read voltage or an operation of searching for an optimum read voltage and a read retry operation using the optimum read voltage, i.e., a defense code operation, which are described with reference to FIG. 9.

After the Tag-B first read retry operation Tag-B Retry1 is completed, the Tag-B data read through the Tag-B first read retry operation Tag-B Retry1 may be output (denoted as "Tag-B Data-out" in FIG. 10). The ECC circuit 730 of the memory controller 1200 may perform a Tag-B ECC operation on the Tag-B data. At this time, the Tag-B ECC operation on the Tag-B data may pass (denoted as "Tag-B Pass" in FIG. 10).

While the ECC circuit 730 of the memory controller 1200 is performing the Tag-B ECC operation on the Tag-B data after the memory device 1100 outputs the Tag-B data ("Tag-B Data-out"), the memory controller 1200 may input a Tag-C first read retry command Tag-C Retry1 to the memory device 1100, and the memory device 1100 may perform a read retry operation corresponding to the Tag-C first read retry command Tag-C Retry1, i.e., a defense code operation corresponding to the Tag-C read operation. In other words, the memory device 1100 enters into a defense code operation corresponding to the Tag-C read operation. A Tag-C first read retry operation Tag-C Retry1 may be performed in a voltage condition that is different from that of the Tag-C read operation. In other words, the Tag-C first read retry operation Tag-C Retry1 may be performed using a new read voltage or an operation of searching for an optimum read voltage and a read retry operation using the optimum read voltage, i.e., a defense code operation, which are described with reference to FIG. 9.

After the Tag-C first read retry operation Tag-C Retry1 is completed, the Tag-C data read through the Tag-C first read retry operation Tag-C Retry1 may be output (denoted as "Tag-C Data-out" in FIG. 10). The ECC circuit 730 of the memory controller 1200 may perform a Tag-C ECC operation on the Tag-C data. The Tag-C ECC operation on the Tag-C data may fail (denoted as "Tag-C Fail" in FIG. 10).

While the ECC circuit 730 of the memory controller 1200 is performing the Tag-C ECC operation on the Tag-C data after the memory device 1100 outputs the Tag-C data ("Tag-C Data-out"), the memory controller 1200 may input a Tag-A second read retry command Tag-A Retry2 to the memory device 1100, and the memory device 1100 may perform a read retry operation corresponding to the Tag-A second read retry command Tag-A Retry2, i.e., a defense code operation corresponding to the Tag-A read operation. A Tag-A second read retry operation Tag-A Retry2 may be performed in a voltage condition different from that of the Tag-A first read retry operation Tag-A Retry1.

After the Tag-A second read retry operation Tag-A Retry2 is completed, the memory device 1100 output the Tag-A data ("Tag-A Data-out") read through the Tag-A second read retry operation Tag-A Retry2. The ECC circuit 730 of the memory controller 1200 may perform a Tag-A ECC operation on the Tag-A data. At this time, the Tag-A ECC operation on the Tag-A data may fail ("Tag-A Fail").

While the ECC circuit 730 of the memory controller 1200 is performing the Tag-A ECC operation on the Tag-A data after the memory device 1100 outputs the Tag-C data ("Tag-C Data-out"), the memory controller 1200 may input Tag-D Read command to the memory device 1100, and perform a read operation corresponding to the Tag-D Read command. Tag-D Read operation nr ay be performed using an initially set read voltage. As another example, the Tag-D Read operation may be performed using a result of a defense code operation corresponding to the Tag-B read operation, Tag B data of which passes the Tag-B ECC operation. In other words, the Tag-D Read operation may be performed using a read voltage changed based on a newly set read voltage as the result of the defense code operation corresponding to the Tag-B read operation. The detailed operation is the same as described with reference to FIG. 9. After read operations in response to Tag-A to Tag-C are started, the memory controller 1200 may receive a command of Tag-D from the host 2000 to be queued.

The Tag-D data read through the Tag-D Read operation performed based on the newly set read voltage as the result of the defense code operation corresponding to the Tag-B read operation may be output from the memory device 1100 to the memory controller 1200 (denoted as "Tag-D Data-out" in FIG. 10). The ECC circuit 730 of the memory controller 1200 may perform a Tag-D ECC operation on the Tag-D data. As a result, the Tag-D ECC operation on the Tag-D data may pass (denoted as "Tag-D Pass" in FIG. 10).

Then, a Tag-C second read retry operation Tag-C Retry2, Tag-C data output (denoted as "Tag-C Data-out" in FIG. 10), and a Tag-C ECC operation may be performed. As a result, the Tag-C ECC operation may pass (denoted as "Tag-C Pass" in FIG. 10). The Tag-C second read retry operation Tag-C Retry2 may be performed in a voltage condition different from that of the Tag-C first read retry operation Tag-C Retry1. In other words, the Tag-C second read retry operation Tag-C Retry2 may be performed using a more optimum read voltage as compared with the Tag-C first read retry operation Tag-C Retry1.

In addition, a Tag-A third read retry operation Tag-A Retry3, Tag-A data output (denoted as "Tag-A Data-out" in FIG. 10), and a Tag-A ECC operation may be performed. As a result, the Tag-A ECC operation may pass (denoted as "Tag-A Pass" in FIG. 10). The Tag-A third read retry operation Tag-A Retry3 may be performed in a voltage condition different from that of the Tag-A second read retry operation Tag-A Retry2. In other words, the Tag-A third read retry operation Tag-A Retry3 may be performed using a more optimum read voltage as compared with the Tag-A second read retry operation Tag-A Retry2.

The Tag-A Read operation or read retry operation, the Tag-B Read operation or read retry operation, the Tag-C Read operation or read retry operation, or the Tag-D Read operation or read retry operation may be an operation for reading different LPG data of the same physical page. As another example, the Tag-A Read operation or read retry operation, the Tag-B Read operation or read retry operation, the Tag-C Read operation or read retry operation, or the Tag-D Read operation or read retry operation may be an operation for reading LPG data of different physical pages included in the same memory block 110. As still another example, the Tag-A Read operation or read retry operation, the Tag-B Read operation or read retry operation, the Tag-C Read operation or read retry operation, or the Tag-D Read operation or read retry operation may be an operation for reading different data sector of the same logical page.

Figure 11:
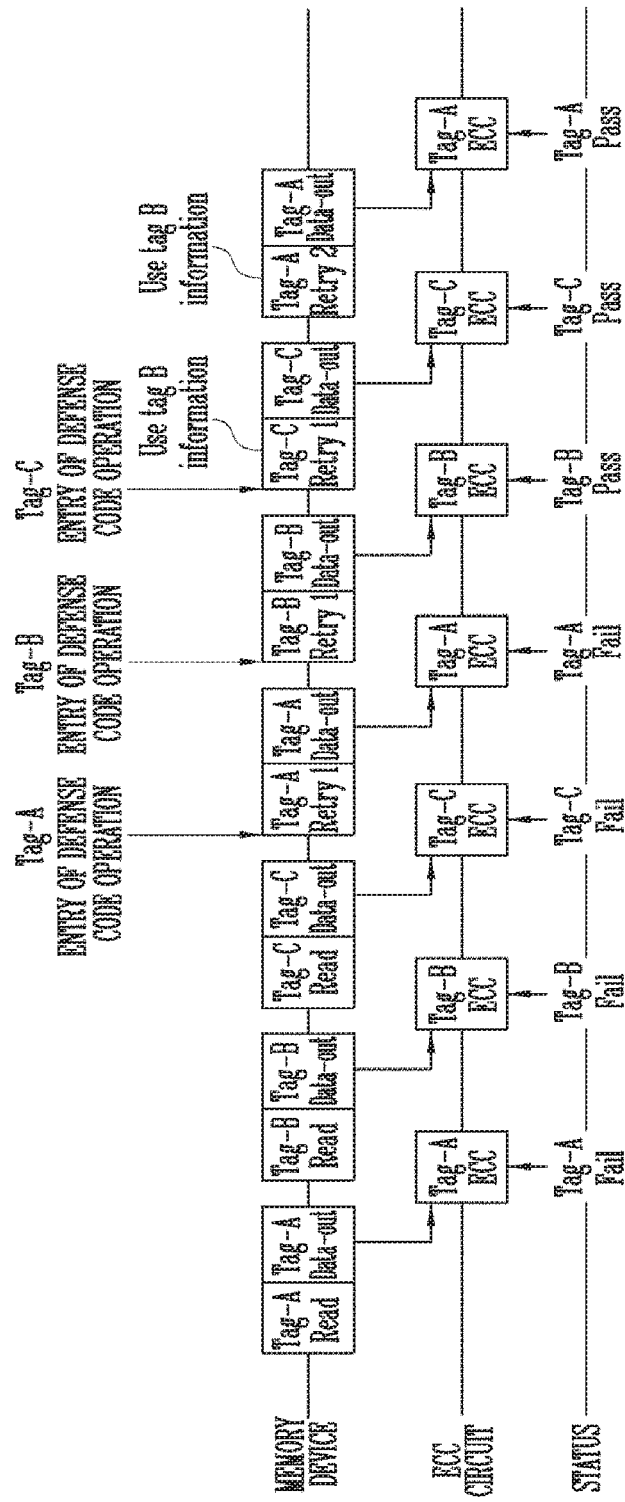
FIG. 11 is a diagram illustrating a method for performing a defense code operation between a plurality of tags in accordance with an embodiment of the present disclosure.

FIG. 11 is a diagram illustrating a method for performing a defense code operation between a plurality of tags, according to another embodiment of the present disclosure.

Referring to FIG. 11, the memory device 1100 may first receive Tag-A Read command from the memory controller 1200 and then perform a Tag-A Read operation in response to the Tag-A Read command. After the Tag-A Read operation is completed, Tag-A data read through the Tag-A Read operation may be output ("Tag-A Data-out"). The ECC circuit 730 of the memory controller 1200 may perform a Tag-A ECC operation on the Tag-A data. The Tag-A ECC operation on the Tag-A data may fail ("Tag-A Fail"). While the ECC circuit 730 of the memory controller 1200 is performing the Tag-A ECC operation on the Tag-A data after the memory device 1100 outputs the Tag-A data ("Tag-A Data-out"), the memory controller 1200 may input a Tag-B Read command to the memory device 1100, and perform a Tag-B Read operation corresponding to the Tag-B Read command. After the Tag-B Read operation is completed, the memory device 1100 may output Tag-B data ("Tag-B Data-out") read through the Tag-B Read operation. The ECC circuit 730 of the memory controller 1200 may perform a Tag-B ECC operation on the Tag-B data. At this time, the Tag-B ECC operation on the Tag-B data may fail ("Tag-B Fail").

While the ECC circuit 730 of the memory controller 1200 is performing the Tag-B ECC operation on the Tag-B data after the memory device 1100 outputs the Tag-B data ("Tag-B Data-out"), the memory controller 1200 may input Tag-C Read command to the memory device 1100, and perform a Tag-C Read operation corresponding to the Tag-C read command. After the Tag-C Read operation is completed, the memory device 1100 may output the Tag-C data ("Tag-C Data-out") read through the Tag-C Read operation. The ECC circuit 730 of the memory controller 1200 may perform a Tag-C ECC operation on the Tag-C data. At this time, the Tag-C ECC operation on the Tag-C data may fail ("Tag-C Fail").

While the ECC circuit 730 of the memory controller 1200 is performing the Tag-C ECC operation on the Tag-C data after the memory device 1100 outputs the Tag-C data, the memory controller 1200 may input Tag-A first read retry command Tag-A Retry1 to the memory device 1100, and the memory device 1100 may perform a Tag-A read retry operation in response to the Tag-A first read retry command Tag-A Retry1, i.e., a defense code operation. In other words, the memory device 1100 enters into a defense code operation corresponding to the Tag-A read operation. A Tag-A first read retry operation Tag-A Retry1 may be performed in a voltage condition different from that of the Tag-A read operation. In other words, the Tag-A first read retry operation Tag-A Retry1 may be performed using a new read voltage or an operation of searching for an optimum read voltage and a read retry operation using the optimum read voltage, i.e., a defense code operation, which are described with reference to FIG. 9.

After the Tag-A first read retry operation Tag-A Retry1 is completed, the Tag-A data output through the Tag-A first read retry operation Tag-A Retry1 may be output ("Tag-A Data-out"). The ECC circuit 730 of the memory controller 1200 may perform a Tag-A ECC operation on the Tag-A data. The Tag-A ECC operation on the Tag-A data may fail ("Tag-A Fail"). While the ECC circuit 730 of the memory controller 1200 is performing the Tag-A ECC operation on the Tag-A data after the memory device 1100 outputs the Tag-A data ("Tag-A Data-out"), the memory controller 1200 may provide Tag-B first read retry command Tag-B Retry1 to the memory device 1100, and the memory device 1100 may perform a read retry operation corresponding to the Tag-B first read retry command Tag-B Retry1, i.e., a defense code operation. In other words, the memory device 1100 enters into a defense code operation corresponding to the Tag-B read operation. A Tag-B first read retry operation Tag-B Retry1 may be performed in a voltage condition different from that of the Tag-B read operation. In other words, the Tag-B first read retry operation Tag-B Retry1 may be performed using a new read voltage or an operation of searching for an optimum read voltage and a read retry operation using the optimum read voltage, i.e., a defense code operation, which are described with reference to FIG. 9.

After the Tag-B first read retry operation Tag-B Retry1 is completed, the Tag-B data read through the Tag-B first read retry operation Tag-B Retry1 may be output ("Tag-B Data-out"). The ECC circuit 730 of the memory controller 1200 may perform a Tag-B ECC operation on the Tag-B data. At this time, the Tag-B ECC operation on the Tag-B data may pass ("Tag-B Pass").

While the ECC circuit 730 of the memory controller 1200 is performing the Tag-B ECC operation on the Tag-B data after the memory device 1100 outputs the Tag-B data ("Tag-B Data-out"), the memory controller 1200 may input a Tag-C first read retry command Tag-C Retry1 to the memory device 1100, and the memory device 1100 may perform a read retry operation corresponding to the Tag-C first read retry command Tag-C Retry1, i.e, a defense code operation. In other words, the memory device 1100 enters into a defense code operation corresponding to the Tag-C read operation. At this time, Tag-C first read retry operation Tag-C Retry1 may use the result of the defense code operation in the Tag-B first read retry operation Tag-B Retry1 that was previously performed. In other words, the Tag-C first read retry operation Tag-C Retry1 may be performed using a read voltage changed based on information on a read voltage close to the more optimum read voltage searched as the result of the defense code operation in the Tag-B first read retry operation Tag-B Retry1 that was previously performed. As a result, the Tag-C ECC operation to the Tag-C data read to be output ("Tag-C Data-out") through the Tag-C first read retry operation Tag-C Retry1 may immediately pass ("Tag-C Pass").

Unlike the embodiment described with reference to FIG. 10, in the embodiment described with reference to FIG. 11, information on a read voltage searched as a result of the defense code operation corresponding to a first tag read operation can be applied to a defense code operation corresponding to a second tag read operation that has been already entered into. In other words, unlike the embodiment described with reference to FIG. 10, even when the defense code operation corresponding to the second tag read operation has already entered at a point of time when the ECC operation passes in a read retry operation, according to the result of the defense code operation corresponding to the first tag read operation, the result of the defense code operation corresponding to the first tag read operation can be used in a read retry operation in the second tag read operation. As a result, it is possible to decrease read latency.

Similarly, a Tag-A second read retry operation Tag-A Retry2 may also use the result of the defense code operation in the Tag-B first read retry operation Tag-B Retry1 that has already been performed. In other words, the Tag-A second read retry operation Tag-A Retry2 may be performed using a read voltage changed based on information on a read voltage close to the more optimum read voltage searched as the result of the defense code operation in the Tag-B first read retry operation Tag-B Retry1 that was previously performed. As a result, the Tag-A ECC operation to data output ("Tag-A Data-out") according to the Tag-A second read retry operation Tag-A Retry2 may immediately pass ("Tag-A Pass").

Figure 12:
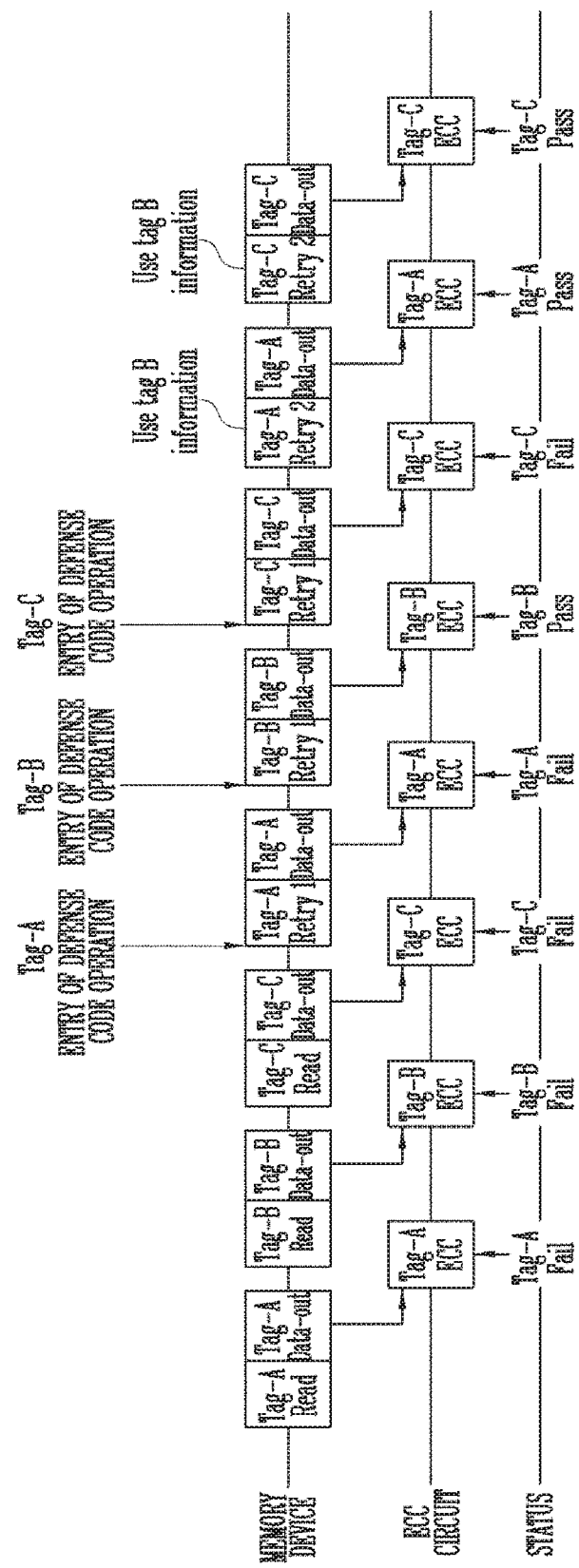
FIG. 12 is a diagram illustrating a method for performing a defense code operation between a plurality of tags in accordance with an embodiment of the present disclosure.

FIG. 12 is a diagram illustrating a method for performing a defense code operation between a plurality of tags, according to another embodiment of the present disclosure.

Referring to FIG. 12, the memory device 1100 may first receive Tag-A Read command from the memory controller 1200 and then perform a Tag-A Read operation in response to the Tag-A Read command. After the Tag-A Read operation is completed, Tag-A data read through the Tag-A Read operation may be output ("Tag-A Data-out"). The ECC circuit 730 of the memory controller 1200 may perform a Tag-A ECC operation on the Tag-A data. The Tag-A ECC operation on the Tag-A data may fail ("Tag-A Fail"). While the ECC circuit 730 of the memory controller 1200 is performing the Tag-A ECC operation on the Tag-A data after the memory device 1100 outputs the Tag-A data ("Tag-A Data-out"), the memory controller 1200 may input a Tag-B Read command to the memory device 1100, and perform a Tag-B Read operation corresponding to the Tag-B Read command. After the Tag-B Read operation is completed, the memory device 1100 may output Tag-B data ("Tag-B Data-out") read through the Tag-B Read operation. The ECC circuit 730 of the memory controller 1200 may perform a Tag-B ECC operation on the Tag-B data. At this time, the Tag-B ECC operation on the Tag-B data may fail ("Tag-B Fail").

While the ECC circuit 730 of the memory controller 1200 is performing the Tag-B ECC operation on the Tag-B data after the memory device 1100 outputs the Tag-B data ("Tag-B Data-out"), the memory controller 1200 may input Tag-C Read command to the memory device 1100, and perform a Tag-C Read operation corresponding to the Tag-C read command. After the Tag-C Read operation is completed, the memory device 1100 may output the Tag-C data ("Tag-C Data-out") read through the Tag-C Read operation. The ECC circuit 730 of the memory controller 1200 may perform a Tag-C ECC operation on the Tag-C data. At this time, the Tag-C ECC operation on the Tag-C data may fail ("Tag-C Fail").

While the ECC circuit 730 of the memory controller 1200 is performing the Tag-C ECC operation on the Tag-C data after the memory device 1100 outputs the Tag-C data, the memory controller 1200 may input Tag-A first read retry command Tag-A Retry1 to the memory device 1100, and the memory device 1100 may perform a read retry operation corresponding to the Tag-A first read retry command Tag-A Retry1, i.e., a defense code operation. In other words, the memory device 1100 enters into a defense code operation corresponding to the Tag-A read operation. A Tag-A first read retry operation Tag-A Retry1 may be performed in a voltage condition different from that of the Tag-A read operation. In other words, the Tag-A first read retry operation Tag-A Retry1 may be performed using a new read voltage or an operation of searching for an optimum read voltage and a read retry operation using the optimum read voltage, i.e., a defense code operation, which are described with reference to FIG. 9.

After the Tag-A first read retry operation Tag-A Retry1 is completed, the Tag-A data output through the Tag-A first read retry operation Tag-A Retry may be output ("Tag-A Data-out"). The ECC circuit 730 of the memory controller 1200 may perform a Tag-A ECC operation on the Tag-A data. The Tag-A ECC operation on the Tag-A data may fail ("Tag-A Fail"). While the ECC circuit 730 of the memory controller 1200 is performing the Tag-A ECC operation on the Tag-A data after the memory device 1100 outputs the Tag-A data ("Tag-A Data-out"), the memory controller 1200 may provide Tag-B first read retry command Tag-B Retry1 to the memory device 1100, and the memory device 1100 may perform a read retry operation corresponding to the Tag-B first read retry command Tag-B Retry1, i.e., a defense code operation. In other words, the memory device 1100 enters into a defense code operation corresponding to the Tag-B read operation. A Tag-B first read retry operation Tag-B Retry1 may be performed in a voltage condition different from that of the Tag-B read operation. In other words, the Tag-B first read retry operation Tag-B Retry1 may be performed using a new read voltage or an operation of searching for an optimum read voltage and a read retry operation using the optimum read voltage, i.e., a defense code operation, which are described with reference to FIG. 9.

After the Tag-B first read retry operation Tag-B Retry1 is completed, the Tag-B data read through the Tag-B first read retry operation Tag-B Retry1 may be output ("Tag-B Data-out"). The ECC circuit 730 of the memory controller 1200 may perform a Tag-B ECC operation on the Tag-B data. At this time, the Tag-B ECC operation on the Tag-B data may pass ("Tag-B Pass").

While the ECC circuit 730 of the memory controller 1200 is performing the Tag-B ECC operation on the Tag-B data after the memory device 1100 outputs the Tag-B data ("Tag-B Data-out"), the memory controller 1200 may input a Tag-C first read retry command Tag-C Retry1 to the memory device 1100, and the memory device 1100 may perform a read retry operation corresponding to the Tag-C first read retry command Tag-C Retry1, i.e., a defense code operation. In other words, the memory device 1100 enters into a defense code operation for the Tag-C read operation. A Tag-C first read retry operation Tag-C Retry1 may start before the Tag-B ECC operation on the Tag-B data is completed. As a result, in the Tag-C first read retry operation Tag-C Retry1, the memory device 1100 does not use the result of the defense code operation in the Tag-B first read retry operation Tag-B Retry1, and may independently perform a defense code operation. The Tag-C data read through the Tag-C first read retry operation Tag-C Retry1 may be output ("Tag-C Data-out"), and a Tag-C ECC operation may be performed on the output Tag-C data. The Tag-C ECC operation on the Tag-C data may fail ("Tag-C Fail").

While the ECC circuit 730 of the memory controller 1200 is performing the Tag-C ECC operation on the Tag-C data after the memory device 1100 outputs the Tag-C data ("Tag-C Data-out"), the memory controller 1200 may input a Tag-A second read retry command Tag-A Retry2 to the memory device 1100, and the memory device 1100 may perform a read retry operation corresponding to the Tag-A second read retry command Tag-A Retry2. At this time, the Tag-A second read retry operation Tag-A Retry2 may use the result of the defense code operation in the Tag-B first read retry operation Tag-B Retry1 that was previously performed. In other words, the Tag-A second read retry operation Tag-A Retry2 may be performed using a read voltage changed based on information on a read voltage close to the more optimum read voltage searched as the result of the defense code operation in the Tag-B first read retry operation Tag-B Retry1 that was previously performed. As a result, the Tag-A ECC operation to the Tag-A data output ("Tag-A Data-out") through the Tag-A second read retry operation Tag-A Retry2 may immediately pass ("Tag-A Pass").

While the ECC circuit 730 of the memory controller 1200 is performing the Tag-A ECC operation on the Tag-A data after the memory device 1100 outputs the Tag-A data ("Tag-A Data-out"), the memory controller 1200 may input a Tag-C second read retry command Tag-C Retry2 to the memory device 1100, and the memory device 1100 may perform a read retry operation in response to the Tag-C second read retry command Tag-C Retry2. At this time, the Tag-C second read retry operation Tag-C Retry2 may use the result of the defense code operation in the Tag-B first read retry operation Tag-B Retry1 that was previously performed. In other words, the Tag-C second read retry operation Tag-C Retry2 may be performed using a read voltage changed based on information on a read voltage close to the more optimum read voltage searched as the result of the defense code operation in the Tag-B first read retry operation Tag-B Retry1 that was previously performed. As a result, the Tag-C ECC operation to the Tag-C data output ("Tag-C Data-out") through the Tag-C second read retry operation Tag-C Retry2 may immediately pass ("Tag-C Pass").

In other words, the memory device 1100 may perform a defense code operation corresponding to a first tag read operation and then enter into a defense code operation corresponding to a second tag read operation before the ECC operation to first tag data read through the defense code operation corresponding to the first tag operation is completed. In this case, the memory device 1100 may not use a result of the defense code operation corresponding to the first tag read operation in the defense code operation corresponding to the second tag read operation. In other words, the result of the defense code operation corresponding to the first tag read operation may be used in the defense code operation corresponding to another tag read operation after it is determined that the ECC operation on the first tag data has passed.

As another example, the memory device 1100 may perform a defense code operation corresponding to a first tag read operation and then enter into a defense code operation corresponding to a second tag read operation before the ECC operation to first tag data read through the defense code operation corresponding to the first tag read operation is completed. In this case, the memory device 1100 may use a result of the defense code operation corresponding to the first tag read operation in the defense code operation corresponding to the second tag read operation. In other words, the result of the defense code operation corresponding to the first tag read operation may be used in the defense code operation corresponding to another tag read operation before it is determined that the ECC operation on the first tag data has passed.

Figure 13:
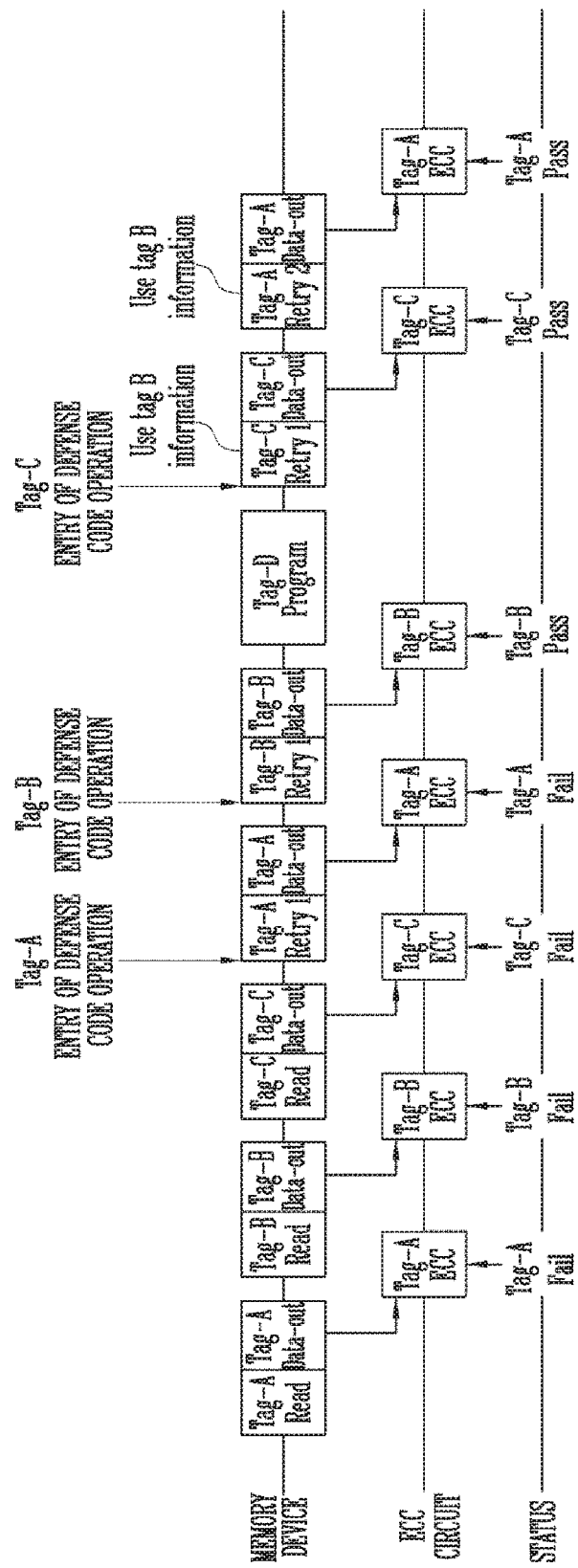
FIG. 13 is a diagram illustrating a method for performing a defense code operation between a plurality of tags in accordance with an embodiment of the present disclosure.

FIG. 13 is a diagram illustrating a method for performing a defense code operation between a plurality of tags, according to another embodiment of the present disclosure.

Referring to FIG. 13, the memory device 1100 may first receive Tag-A Read command from the memory controller 1200 and then perform a Tag-A Read operation in response to the Tag-A Read command. After the Tag-A Read operation is completed, Tag-A data read through the Tag-A Read operation may be output ("Tag-A Data-out"). The ECC circuit 730 of the memory controller 1200 may perform a Tag-A ECC operation on the Tag-A data. The Tag-A ECC operation on the Tag-A data may fail ("Tag-A Fail"). While the ECC circuit 730 of the memory controller 1200 is performing the Tag-A ECC operation on the Tag-A data after the memory device 1100 outputs the Tag-A data ("Tag-A Data-out"), the memory controller 1200 may input a Tag-B Read command to the memory device 1100, and perform a Tag-B Read operation corresponding to the Tag-B Read command. After the Tag-B Read operation is completed, the memory device 1100 may output Tag-B data ("Tag-B Data-out") read through the Tag-B Read operation. The ECC circuit 730 of the memory controller 1200 may perform a Tag-B ECC operation on the Tag-B data. At this time, the Tag-B ECC operation on the Tag-B data may fail ("Tag-B Fail").

While the ECC circuit 730 of the memory controller 1200 is performing the Tag-B ECC operation on the Tag-B data after the memory device 1100 outputs the Tag-B data ("Tag-B Data-out"), the memory controller 1200 may input Tag-C Read command to the memory device 1100, and perform a Tag-C Read operation corresponding to the Tag-C read command. After the Tag-C Read operation is completed, the memory device 1100 may output the Tag-C data ("Tag-C Data-out") read through the Tag-C Read operation. The ECC circuit 730 of the memory controller 1200 may perform a Tag-C ECC operation on the Tag-C data. At this time, the Tag-C ECC operation on the Tag-C data may fail ("Tag-C Fail").

While the ECC circuit 730 of the memory controller 1200 is performing the Tag-C ECC operation on the Tag-C data after the memory device 1100 outputs the Tag-C data, the memory controller 1200 may input Tag-A first read retry command Tag-A Retry1 to the memory device 1100, and the memory device 1100 may perform a read retry operation corresponding to the Tag-A first read retry command Tag-A Retry1, i.e., a defense code operation. In other words, the memory device 1100 enters into a defense code operation corresponding to the Tag-A read operation. A Tag-A first read retry operation Tag-A Retry1 may be performed in a voltage condition different from that of the Tag-A read operation. In other words, the Tag-A first read retry operation Tag-A Retry1 may be performed using a new read voltage or an operation of searching for an optimum read voltage and a read retry operation using the optimum read voltage, i.e., a defense code operation, which are described with reference to FIG. 9.

After the Tag-A first read retry operation Tag-A Retry1 is completed, the Tag-A data output through the Tag-A first read retry operation Tag-A Retry1 may be output ("Tag-A Data-out"). The ECC circuit 730 of the memory controller 1200 may perform a Tag-A ECC operation on the Tag-A data. The Tag-A ECC operation on the Tag-A data may fail ("Tag-A Fail"). While the ECC circuit 730 of the memory controller 1200 is performing the Tag-A ECC operation on the Tag-A data after the memory device 1100 outputs the Tag-A data ("Tag-A Data-out"), the memory controller 1200 may provide Tag-B first read retry command Tag-B Retry1 to the memory device 1100, and the memory device 1100 may perform a read retry operation corresponding to the Tag-B first read retry command Tag-B Retry1, i.e., a defense code operation. In other words, the memory device 1100 enters into a defense code operation corresponding to the Tag-B read operation. A Tag-B first read retry operation Tag-B Retry1 may be performed in a voltage condition different from that of the Tag-B read operation. In other words, the Tag-B first read retry operation Tag-B Retry1 may be performed using a new read voltage or an operation of searching for an optimum read voltage and a read retry operation using the optimum read voltage, i.e., a defense code operation, which are described with reference to FIG. 9.

After the Tag-B first read retry operation Tag-B Retry1 is completed, the Tag-B data read through the Tag-B first read retry operation Tag-B Retry1 may be output ("Tag-B Data-out"). The ECC circuit 730 of the memory controller 1200 may perform a Tag-B ECC operation on the Tag-B data. At this time, the Tag-B ECC operation on the Tag-B data may pass ("Tag-B Pass").

After memory device 1100 outputs the Tag-B data ("Tag-B Data-out"), the memory controller 1200 may input a Tag-D program command to the memory device 1100, and the memory device 1100 may perform a Tag-D program operation in response to the Tag-D program command.

After the Tag-D program operation in response to the Tag-D program command is ended, the memory controller 1200 may input a Tag-C first read retry command Tag-C Retry1 to the memory device 1100, and the memory device 1100 may perform a read retry operation corresponding to the Tag-C first read retry command Tag-C Retry1, i.e., a defense code operation. In other words, the memory device 1100 enters into a defense code operation corresponding to the Tag-C read operation. At this time, the Tag-C first read retry operation Tag-C Retry1 may use the result of the defense code operation in the Tag-B first read retry operation Tag-B Retry1 that was previously performed. In other words, the Tag-C first read retry operation Tag-C Retry1 may be performed using a read voltage changed based on information on a read voltage close to the more optimum read voltage searched as the result of the defense code operation in the Tag-B first read retry operation Tag-B Retry1 that was previously performed. As a result, the Tag-C ECC operation to the Tag-C data read to be output ("Tag-C Data-out") through the Tag-C first read retry operation Tag-C Retry1 may immediately pass ("Tag-C Pass").

Unlike the embodiments described with reference to FIGS. 10 to 12, in the embodiment described with reference to FIG. 13, information on a read voltage searched as a result of a defense code operation corresponding to a first tag read operation can be applied to a defense code operation corresponding to a second tag read operation that is not yet entered into or is newly entered. In other words, unlike the embodiments described with reference to FIGS. 10 to 12, the result of the defense code operation corresponding to the first tag read operation can be used in a read retry operation corresponding to the second tag read operation even when the memory device 1100 does not still enter into a defense code operation corresponding to the second tag read operation at a point of time when the ECC correction of the read retry operation passes based on the result of the defense code operation corresponding to the first tag read operation. As a result, it is possible to decrease read latency.

While the ECC circuit 730 of the memory controller 1200 is performing the Tag-C ECC operation on the Tag-C data after the memory device 1100 outputs the Tag-C data ("Tag-C Data-out"), the memory controller 1200 may input a Tag-A second read retry command Tag-A Retry2 to the memory device 1100, and the memory device 1100 may perform a read retry operation corresponding to the Tag-A second read retry command Tag-A Retry2. At this time, the Tag-A second read retry operation Tag-A Retry2 may use the result of the defense code operation in the Tag-B first read retry operation Tag-B Retry1 that was previously performed. In other words, the Tag-A second read retry operation Tag-A Retry2 may be performed using a read voltage changed based on information on a read voltage close to the more optimum read voltage searched as the result of the defense code operation in the Tag-B first read retry operation Tag-B Retry1 that was previously performed. As a result, the Tag-A ECC operation to the Tag-A data output ("Tag-A Data-out") through the Tag-A second read retry operation Tag-A Retry2 may immediately pass ("Tag-A Pass").

Figure 14:
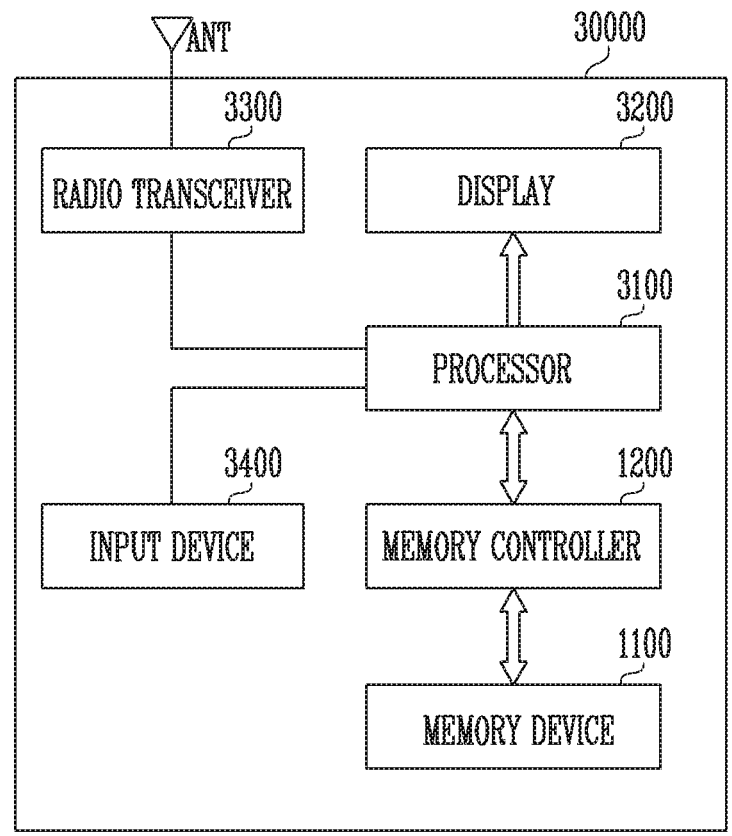
FIG. 14 is a diagram illustrating an exemplary configuration of the memory system including the memory controller shown in FIG. 2 and the memory device shown in FIG. 3.

FIG. 14 is a diagram illustrating another embodiment of the memory system including the memory controller shown in FIG. 2 and the memory device shown in FIG. 3.

Referring to FIG. 14, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may program the signal processed by the processor 3100 in the semiconductor memory device 1100.

Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the memory controller 1200, data output from the radio transceiver 3300, or data output from the input device 3400 can be displayed through the display 3200.

In some embodiments, the memory controller 1200 capable of controlling an operation of the memory device 1100 may be implemented as a part of the processor 3100, or be implemented as a chip separate from the processor 3100.

Figure 15:
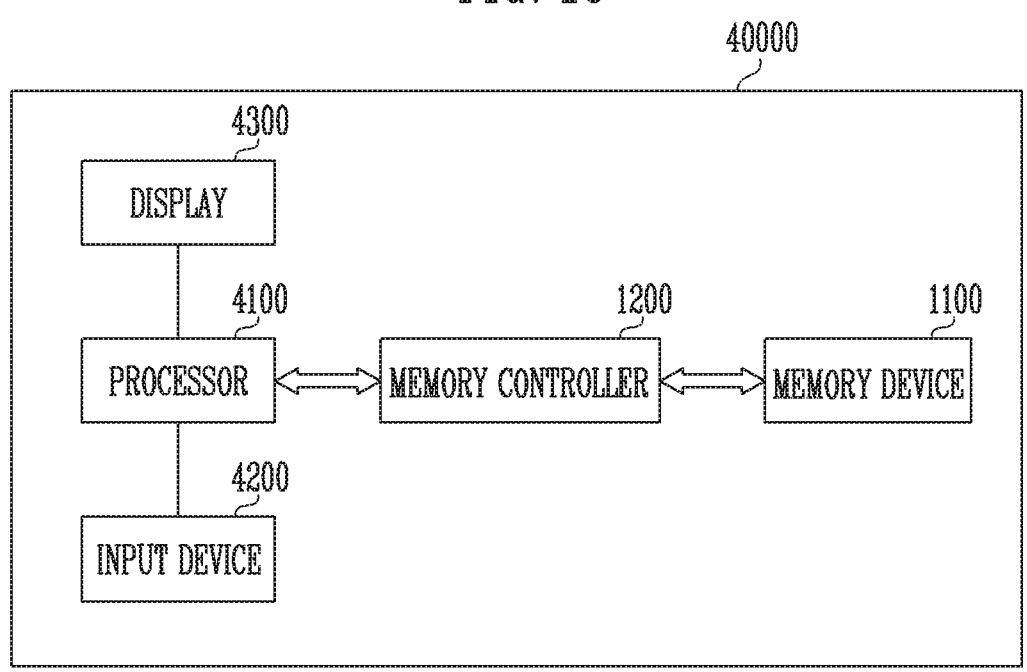
FIG. 15 is a diagram illustrating an exemplary configuration of the memory system including the memory controller shown in FIG. 2 and the memory device shown in FIG. 3.

FIG. 15 is a diagram illustrating another embodiment of the memory system including the memory controller shown in FIG. 2 and the memory device shown in FIG. 3.

Referring to FIG. 15, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data inputted through an input device 4200. For example, the input device 4200 may be implemented as a pointing device such as a touch pad or a computer mouse, a keypad, or a keyboard.

The processor 4100 may control the overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 16:
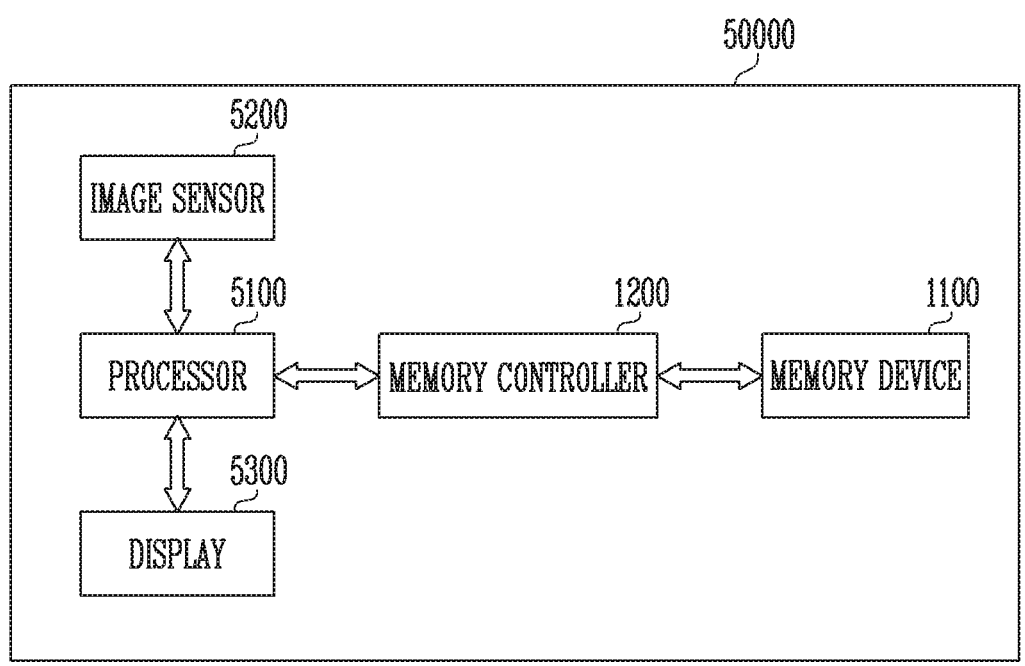
FIG. 16 is a diagram illustrating an exemplary configuration of the memory system including the memory controller shown in FIG. 2 and the memory device shown in FIG. 3.

FIG. 16 is a diagram illustrating another embodiment of the memory system including the memory controller shown in FIG. 2 and the memory device shown in FIG. 3.

Referring to FIG. 16, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be displayed through a display 5300, or be stored in the memory device 1100 through the memory controller 1200. In addition, data stored in the memory device 1100 may be displayed through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 17:
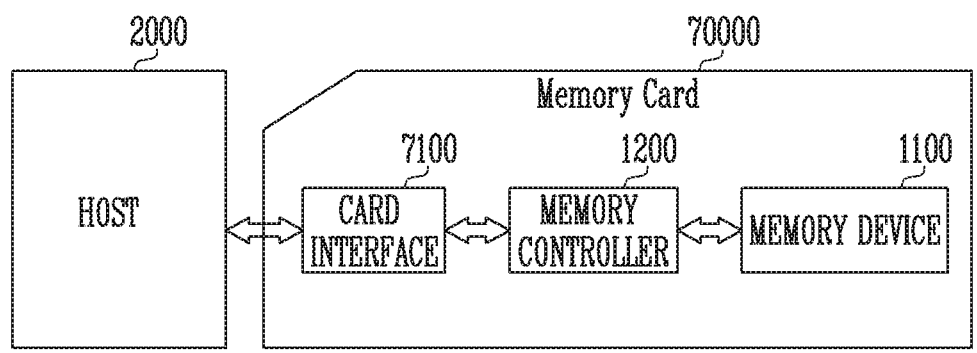
FIG. 17 is a diagram illustrating an exemplary configuration of the memory system including the memory controller shown in FIG. 2 and the memory device shown in FIG. 3.

FIG. 17 is a diagram illustrating another embodiment of the memory system including the memory controller shown in FIG. 2 and the memory device shown in FIG. 3.

Referring to FIG. 17, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may mean hardware capable of supporting a protocol used by the host 60000, software embedded in the hardware, or a signal transmission scheme.

According to the present disclosure, a result of a defense code operation corresponding to a tag, which was previously performed, is used for a tag on which the defense code operation is to be performed next time, so that it is possible to decrease read latency of the memory system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present disclosure as set forth in the following claims.

What is claimed is:

1. A method for operating a memory system, the method comprising:
performing a first read operation on a first page with a first bias condition in response to a first tag;
performing a second read operation on a second page in response to a second tag; and then
performing a first read retry operation on the first page corresponding to the first tag, with a second bias condition different from the first bias condition; and
performing a second read retry operation on the second page corresponding to the second tag,
wherein, in response to a success of an error correction operation on data output through the first read retry operation, the second read retry operation on the second page is performed based on the second bias condition, and
wherein the performing the second read retry operation is started before the error correction operation on the data output through the first read retry operation is completed.

2. The method of claim 1,
wherein the first page and the second page are included in a same memory block.

3. The method of claim 2,
wherein the first page and the second page are included in a same physical page.

4. The method of claim 3,
wherein the first page is one logical page of the same physical page and the second page is another logical page other than the one logical page of the same physical page.

5. The method of claim 3,
wherein the first page represent data of one sector among the plurality of sectors in one logical page of a physical page and the second page represent data of another sector other than the one sector in the one logical page.

6. A memory system, comprising:
a data storage region including a first page and a second page; and
a controller configured to control a read operation on the data storage region, to control a read retry operation on the data storage region with a different bias condition from the read operation, and to perform an error correction operation on data output through the read retry operation or the read retry operation,
wherein, when the error correction operation on data provided from the read retry operation on the first page succeeds after starting the read operation on the second page, the controller controls the read retry operation on the second page based on the bias condition of the read retry operation on the first page, and
wherein the read operation on the second page is started before the error correction operation on the data provided from the read retry operation on the first page is completed.

7. The memory system of claim 6, wherein the first page and the second page are included in a same memory block.

8. The memory system of claim 6, wherein the first page and the second page are included in a same physical page.

9. The memory system of claim 8, wherein the first page is one logical page of the same physical page and the second page is another logical page other than the one logical page of the same physical page.

10. The memory system of claim 8, wherein the first page represent data of one sector among the plurality of sectors in one logical page of a physical page and the second page represent data of another sector other than the one sector in the one logical page.

* * * * *